(12) United States Patent
Hatakeyama

(10) Patent No.: US 8,088,554 B2
(45) Date of Patent: Jan. 3, 2012

(54) BOTTOM RESIST LAYER COMPOSITION AND PATTERNING PROCESS USING THE SAME

(75) Inventor: Jun Hatakeyama, Niigata (JP)

(73) Assignee: Shin-Etsu Chemical Co., Ltd, Tokyo (JP)

(*) Notice: Subject to any disclaimer, the term of this patent is extended or adjusted under 35 U.S.C. 154(b) by 0 days.

(21) Appl. No.: 12/656,825

(22) Filed: Feb. 17, 2010

(65) Prior Publication Data

US 2010/0151382 A1    Jun. 17, 2010

Related U.S. Application Data

(62) Division of application No. 11/373,199, filed on Mar. 13, 2006, now abandoned.

(30) Foreign Application Priority Data

Apr. 14, 2005    (JP) .................................. 2005-116897

(51) Int. Cl.
G03F 7/00 (2006.01)
G03F 7/004 (2006.01)
(52) U.S. Cl. .................................................. 430/270.1
(58) Field of Classification Search ............... 430/270.1, 430/927
See application file for complete search history.

(56) References Cited

U.S. PATENT DOCUMENTS

| | | | |
|---|---|---|---|
| 5,886,119 A | 3/1999 | Schaedeli et al. | |
| 5,972,560 A | 10/1999 | Kaneko et al. | |
| 6,013,407 A * | 1/2000 | Kawata et al. | 430/191 |
| 6,028,154 A | 2/2000 | Schaedeli et al. | |
| 6,042,989 A | 3/2000 | Schaedeli et al. | |

(Continued)

FOREIGN PATENT DOCUMENTS

JP    A-06-118651    4/1994

(Continued)

OTHER PUBLICATIONS

W. Brunsvold et al., "Evaluation of a Deep UV Bilayer Resist for Sub-Half Mircron Lithography," SPIE vol. 1925 (1993) pp. 377-387.

(Continued)

*Primary Examiner* — Amanda C. Walke
(74) *Attorney, Agent, or Firm* — Oliff & Berridge, PLC

(57) ABSTRACT

There is disclosed a bottom resist layer composition for a multilayer-resist film used in lithography which comprises, at least, a polymer having a repeating unit represented by the following general formula (1). Thereby, there can be provided a bottom resist layer composition which shows an antireflection effect against an exposure light by combining with an intermediate resist layer having an antireflection effect if necessary, has a higher etching resistance during etching a substrate than polyhydroxy styrene, cresol novolac resin, etc., has a high poisoning-resistant effect, and is suitable for using in a multilayer-resist process like a bilayer resist process or a trilayer resist process.

(1)

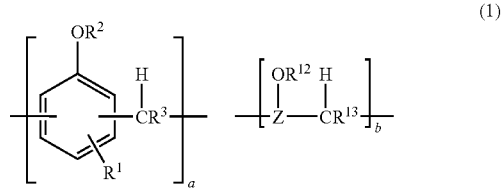

2 Claims, 3 Drawing Sheets

U.S. PATENT DOCUMENTS

| | | | |
|---|---|---|---|
| 6,309,796 | B1 | 10/2001 | Nakashima et al. |
| 6,420,088 | B1 | 7/2002 | Angelopoulos et al. |
| 6,506,497 | B1 | 1/2003 | Kennedy et al. |
| 6,623,909 | B2 | 9/2003 | Hatakeyama et al. |
| 7,309,560 | B2 * | 12/2007 | Sakamoto et al. .......... 430/270.1 |
| 7,314,702 | B2 * | 1/2008 | Lee et al. .................... 430/270.1 |
| 7,476,485 | B2 * | 1/2009 | Hatakeyama et al. ...... 430/270.1 |
| 7,582,407 | B2 * | 9/2009 | Savariar-Hauck et al. 430/270.1 |
| 7,736,822 | B2 * | 6/2010 | Hashimoto et al. ................ 430/5 |
| 7,816,067 | B2 * | 10/2010 | Enomoto et al. ........... 430/270.1 |
| 2002/0012871 | A1 | 1/2002 | Hatakeyama et al. |
| 2002/0058205 | A1 | 5/2002 | Nakashima et al. |
| 2002/0086934 | A1 | 7/2002 | Kawaguchi et al. |
| 2004/0146809 | A1 | 7/2004 | Lee et al. |

FOREIGN PATENT DOCUMENTS

| | | | |
|---|---|---|---|
| JP | 09015855 A * | 1/1997 | |
| JP | A-09-110938 | 4/1997 | |
| JP | A-10-324748 | 12/1998 | |
| JP | A-11-302382 | 11/1999 | |
| JP | 2000292924 A * | 10/2000 | |
| JP | A-2001-040293 | 2/2001 | |
| JP | A-2002-014474 | 1/2002 | |
| JP | A-2002-055456 | 2/2002 | |
| JP | A-2002-214777 | 7/2002 | |
| JP | A-2002-305187 | 10/2002 | |
| JP | A-2005-156816 | 6/2005 | |

OTHER PUBLICATIONS

J. Hatakeyama et al., "Investigation of Discrimination Enhancement in Polysilsesquioxane Based Positive Resist for ArF Lithography," SPIE vol. 3333 (1998) p. 62-72.

A. J. Blakeney et al., "Evauation of Materials for 193-nm Lithography," Journal of Photopolymer Science and Technology and Technol. vol. 9 No. 3 (1996) p. 435-446.

R. Kwong et al., "IBM 193nm Bilayer Resist: Materials, Lithographic Performance and Optimization," SPIE vol. 4345 (2001) p. 50-56.

J. M. Moran et al., "High resolution, steep profile resist patterns," J. Vac. Sci. Technol., 16(6), Nov./Dec. 1979.

T. Lynch et al., "Properties and Performance of Near UV Reflectivity Control Layers," SPIE vol. 2195, p. 225-229 (1994).

Japanese Office Action, Notification of Reasons for Refusal dated Nov. 4, 2009 for corresponding Japanese application. (with English Language version).

* cited by examiner

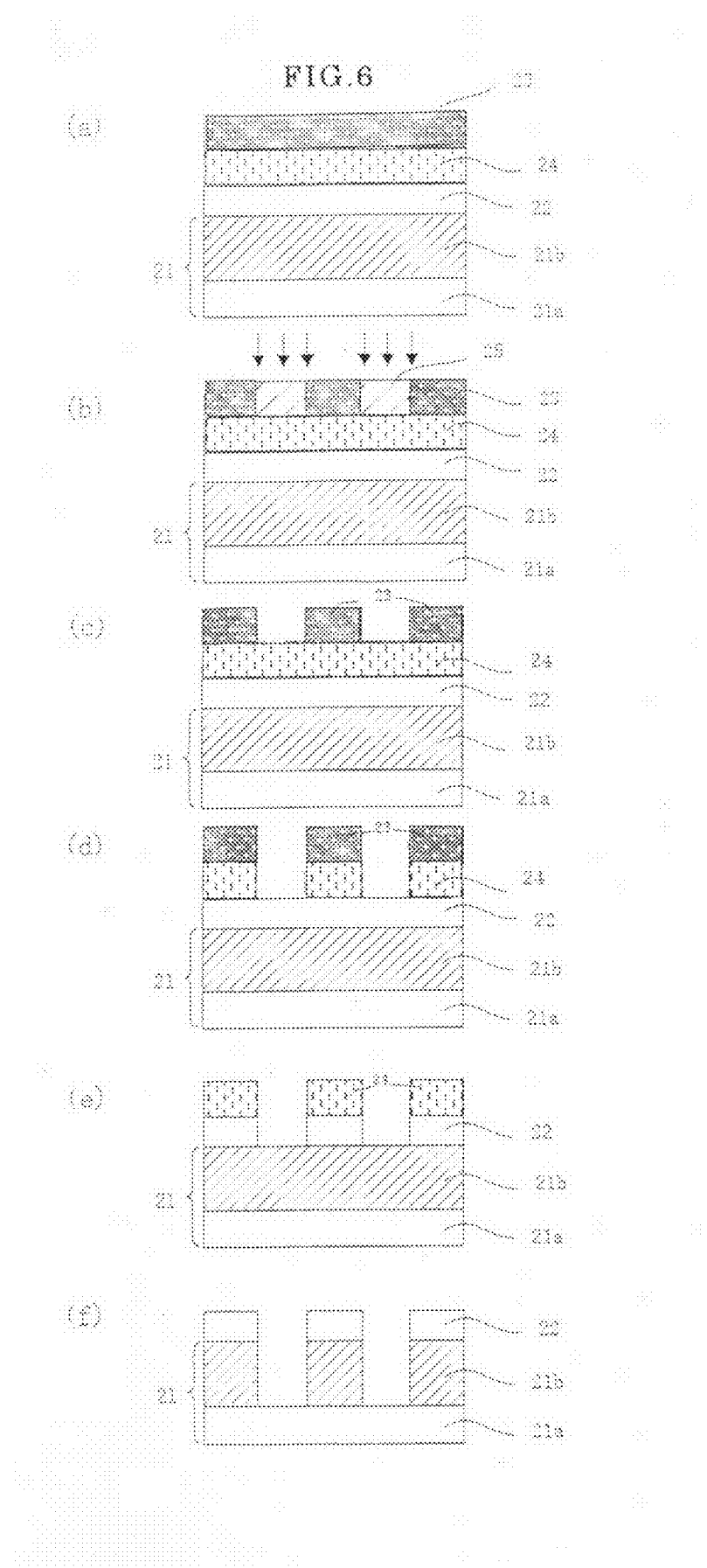

BOTTOM RESIST LAYER COMPOSITION AND PATTERNING PROCESS USING THE SAME

This is a Division of application Ser. No. 11/373,199 filed Mar. 13, 2006, which claims priority to Japanese Patent Application No. 2005-116897 filed Apr. 14, 2005. The disclosure of the prior applications is hereby incorporated by reference herein in their entirety.

BACKGROUND OF THE INVENTION

1. Field of the Invention

The present invention relates to a bottom resist layer composition useful for a multilayer-resist process used for micro-patterning in production process of semiconductor devices etc, and especially to a bottom resist layer composition of a trilayer resist film suitable for exposure with far ultraviolet rays at a wavelength of 300 nm or less like KrF excimer laser light (248 nm) and ArF excimer laser light (193 nm). Furthermore, the present invention also relates to a patterning process for forming a pattern on a substrate with lithography using the composition.

2. Description of the Related Art

It has been needed to make a finer pattern rule along with a tendency in which integration and speed of LSI have become higher in recent years. And in lithography using optical exposure which is used as a general technique at present, resolution has almost reached the inherent limit derived from a wavelength of a light source.

Optical exposure has been widely used using g line (436 nm) or i line (365 nm) of a mercury-vapor lamp as a light source for lithography when a resist pattern is formed. It has been considered that a method of using an exposure light with a shorter wavelength is effective as a means for achieving a further finer pattern. For this reason, for example, KrF excimer laser at a shorter wavelength of 248 nm has been used as an exposure light source instead of i line (365 nm), for mass-production process of a 64 M bit DRAM processing method. However, a light source at far shorter wavelength is needed for manufacture of DRAM with an integration of 1 G or more which needs a still finer processing technique (for example, a processing dimension is 0.13 µm or less), and lithography using ArF excimer laser (193 nm) has been especially examined.

On the other hand, it has been known so far that a multi-layer-resist process such as a bilayer resist process or a trilayer resist process is excellent in order to form a pattern with a high aspect ratio on a nonplanar substrate.

Especially, it is supposed that it is preferable to use a high-molecular silicone compound having a hydrophilic group, such as a hydroxy group, a carboxyl group, etc. as a base resin of a top resist layer composition, in order to develop a bilayer resist film with a general alkaline developer in a bilayer resist process.

As the high-molecular silicone compound, there have been proposed for KrF excimer lasers a silicone chemically amplified positive-resist composition in which polyhydroxy benzyl silsesquioxane, which is a stable alkali-soluble silicone polymer, in which some phenolic hydroxyl groups are protected by a t-Boc group is used as a base resin, and which is combined with an acid generator (for example, see Japanese Patent Application Laid-open (KOKAI) No. 6-118651 and SPIE vol. 1925 (1993) p 377). Moreover, there have been proposed for ArF excimer lasers a positive resist in which silsesquioxane that a cyclohexyl carboxylic acid is substituted with an acid labile group is used as a base resin (for example, see Japanese Patent Application Laid-open (KOKAI) No. 10-324748, Japanese Patent Application Laid-open (KOKAI) No. 11-302382, and SPIE vol. 3333 (1998) p 62). Furthermore, there has been proposed for $F_2$ laser a positive resist in which silsesquioxane having a hexafluoro isopropanol as a soluble group is used as a base resin (for example, see Japanese Patent Application Laid-open (KOKAI) No. 2002-55456).

These high-molecular silicone compounds contain poly silsesquioxane containing a ladder structure formed by the condensation polymerization of a trialkoxy silane or a tri halogenated silane in a main chain.

As a base polymer for resist in which silicon is suspended from a side chain, (meth)acrylate polymer containing silicon is proposed (for example, see Japanese Patent Application Laid-open (KOKAI) No. 9-110938 and J. Photopolymer Sci. and Technol. Vol. 9 No. 3 (1996) p 435-446).

Examples of a bottom resist layer used for a bilayer-resist process may preferably include a hydrocarbon compound which can be etched with oxygen gas. It is also desirable for the bottom resist layer to have a high etching resistance, since the layer is further used as a mask in the case of etching a substrate under the layer. When etching of the bottom resist layer using a top resist layer as a mask is conducted according to oxygen gas etching, it is preferable that the bottom resist layer consists of only hydrocarbons which do not contain a silicon atom. Moreover, in order to improve a line width controllability of the top resist layer containing silicon atoms and to reduce irregularity on a pattern side wall and collapse of a pattern due to a stationary wave, it is preferable that the bottom resist layer also has a function as an antireflection film. Specifically, it is desirable that a reflectivity from the bottom resist layer to the top resist layer can be suppressed to 1% or less.

Then, the reflectivity can be suppressed to 1% or less by applying a composition having an optimal refractive index n value which is a real part of refractive index, and an optimal extinction coefficient k value which is an imaginary part of refractive index with a suitable thickness.

Here results of calculation of reflectivity of a substrate while a thickness of a bottom resist layer was changed in a range of 0-500 nm are shown in the FIG. 1 and FIG. 2. It was premised that an exposure wavelength was 193 nm, n value of a top resist layer was 1.74 and k value of that was 0.02.

FIG. 1 is a graph which shows a fluctuation of reflectivity of a substrate while k value of a bottom resist layer was fixed at 0.3, a vertical axis signifies n value of that, a horizontal axis signifies a thickness of the bottom resist layer, the n value was changed in a range of 1.0-2.0, and the thickness was changed in a range of 0-500 nm. In FIG. 1, in the case of assuming a bottom resist layer with a thickness of 300 nm or more for a bilayer resist process, it is found that an optimum value to suppress reflectivity to 1% or less exists in a range of 1.6-1.9 of a refractive index (n value) which is as much as or a little higher than that of a top resist layer.

FIG. 2 is a graph which shows a fluctuation of reflectivity of a substrate while n value of a bottom resist layer was fixed at 1.5, a vertical axis signifies k value of that, a horizontal axis signifies a thickness of the layer, the k value was changed in a range of 0-0.8, and the thickness was changed in a range of 0-500 nm. In FIG. 2, in the case of assuming a bottom resist layer with a thickness of 300 nm or more for a bilayer resist process, it is found that reflectivity can be suppressed to 1% or less when k value is in a range of 0.24-0.15. On the other hand, an optimum k value of antireflection film used with a thin thickness of about 40 nm for a single layer resist process is 0.4-0.5, which is different from an optimum k value of a bottom resist layer with a thickness of 300 nm or more for a bilayer resist process. As described above, it has been revealed that a bottom resist layer with lower k value, namely, with higher transparency is needed in a bilayer resist process.

Then, a copolymer of a polyhydroxy styrene and an acrylate has been examined as a bottom resist layer composition for a wavelength of 193 nm (for example, see SPIE Vol. 4345 (2001) p 50). Polyhydroxy styrene has a very strong absorption at a wavelength of 193 nm, and the k value of itself is high of about 0.6. Then, the k value is adjusted to about 0.25 by carrying out copolymerization with acrylate of which k value is almost 0.

However, etching resistance of acrylate is low during etching of a substrate, compared with that of polyhydoroxystyrene, and it is indispensable to copolymerize acrylate at a significant ratio in order to lower the k value. As a result, etching resistance during etching of a substrate is significantly lowered. The etching resistance influences not only an etch rate but generation of surface roughness after etching. The increase of surface roughness after etching becomes serious due to copolymerization of acrylate.

Then, it has been proposed to use a naphthalene ring which is one of those having a higher transparency at a wavelength of 193 nm than a benzene ring and high etching resistance. For example, there has been proposed a bottom resist layer which has a naphthalene ring or an anthracene ring (for example, see Japanese Patent Application Laid-open (KOKAI) No. 2002-14474). However, k value of a naphthol copolycondensation novolac resin and a polyvinyl naphthalene resin is between 0.3 and 0.4, and does not reach a desired transparency of 0.1 to 0.3, and thus it is necessary to raise a transparency further in order to obtain a desired antireflection effect. Moreover, n value at a wavelength of 193 nm of a naphthol copolycondensation novolac resin and a polyvinyl naphthalene resin is low, and it is 1.4 in a naphthol copolycondensation novolac resin, and is 1.2 in a polyvinyl naphthalene resin according to measurement by the present inventors, and which do not reach the desired range. Furthermore, although an acenaphthylene polymer is proposed (for example, see Japanese Patent Application Laid-open (KOKAI) No. 2001-40293 and Japanese Patent Application Laid-open (KOKAI) No. 2002-214777), n value at a wavelength of 193 nm is lower than that at a wavelength of 248 nm, k value is high, and neither n nor k reaches the desired values.

As described above, a bottom resist layer which has high n value, low k value, high transparency, and a high etching resistance is needed in a bilayer resist process.

On the other hand, a trilayer resist process stacking a top resist layer of a single layer resist without containing silicon, an intermediate resist layer containing silicon atoms under the top layer, and a bottom resist layer of an organic layer under the intermediate layer (for example, see J. Vac. Sci. Technol., 16(6), November/December 1979).

In general, a single layer resist which is a top resist layer of a trilayer resist process and does not contain silicon is superior in resolution to a silicon-containing resist which is a top resist layer of a bilayer resist process. Therefore, a single layer resist with high resolution can be used as an exposure imaging layer in a trilayer resist process.

Moreover, a Spin On Glass (SOG) film is used as an intermediate resist layer, and many SOG films have been suggested.

Here an optimum optical constant (n value, k value) to suppress reflection from a substrate in a trilayer resist process is different from that in a bilayer resist process. The purpose to suppress reflection from a substrate as much as possible, in particular, to suppress a reflectivity of a substrate to 1% or less is the same in both a bilayer resist process and a trilayer resist process. However, antireflection effect is given only to a bottom resist layer in a bilayer resist process, it can be given to either an intermediate resist layer or a bottom resist layer, or to both of them in a trilayer resist process.

For example, an intermediate resist layer containing silicon with antireflection effect has been suggested (for example, see U.S. Pat. No. 6,506,497 specification and U.S. Pat. No. 6,420,088 specification).

In general, antireflection effect is higher in a multi-layer antireflection film than in a single-layer antireflection film. Therefore, the multi-layer antireflection film has been widely and industrially used as an antireflection film for optical materials. And, high antireflection effect can be obtained by giving antireflection effect to both an intermediate resist layer and a bottom resist layer in a trilayer resist process. Namely, if an intermediate resist layer containing silicon atoms functions as an antireflection layer in a trilayer resist process, it is not particularly necessary for a bottom resist layer to function as a superior antireflection layer. A high etching resistance during process of a substrate is rather necessary for a bottom resist layer in a trilayer resist process than antireflection effect.

Here FIG. 3 is a graph which shows a fluctuation of reflectivity of a substrate while n value of a bottom resist layer was fixed at 1.5, k value thereof was fixed at 0.6, a thickness thereof was fixed at 500 nm, n value of an intermediate resist layer was fixed at 1.5, k value thereof was changed in a range of 0-0.4, and a thickness thereof was changed in a range of 0-400 nm.

In FIG. 3, it is found that a sufficient antireflection effect to suppress reflectivity of a substrate to 1% or less can be obtained by setting k value of an intermediate resist layer to be low of 0.2 or less and a thickness thereof properly. k value of an intermediate resist layer as an antireflection layer with a thickness of 100 nm or less is generally necessary to be 0.2 or more in order to suppress a reflectivity of a substrate to 1% or less (see FIG. 2). However, because a bottom resist layer can suppress reflection to some extent in a trilayer structure, k value of an intermediate resist layer is optimum in a range of 0.2 or less.

Next, FIG. 4 and FIG. 5 are graphs which show a fluctuation of reflectivity of a substrate while k value of a bottom resist layer was fixed at 0.2 and 0.6 respectively, and a thickness of an intermediate resist layer and a thickness of a bottom resist layer were changed. The bottom resist layer with k value of 0.2 simulates a bottom resist layer optimized for a bilayer resist process, and the bottom resist layer with k value of 0.6 simulates novolac resin or polyhydroxy styrene exposed to a light at a wavelength of 193 nm. Although a thickness of a bottom resist layer fluctuates depending on topography of a substrate, a thickness of an intermediate resist layer is considered not to fluctuate and the intermediate layer can be applied with a prescribed thickness.

Here, when k value of a bottom resist layer is high (k value is 0.6), a reflectivity of a substrate can be suppressed to 1% or less with a thinner thickness of the bottom layer by selecting an optimum thickness of an intermediate resist layer like 50 nm, 110 nm and 170 nm. When k value of a bottom resist layer is 0.2, a thickness of an intermediate resist layer is hardly limited to suppress a reflectivity of a substrate to 1% or less at 250 nm thickness of the bottom layer. From a standpoint of expanding a selective range of a thickness of an intermediate resist layer suppressing reflection from a substrate, 0.2 is preferable to 0.6 as k value of a bottom resist layer. However, as to an etching resistance during etching a substrate of compositions of which k values at a wavelength of 193 nm are 0.2 and 0.6 respectively, the composition with k value of 0.6 is generally higher. Furthermore, a bottom resist layer with k value of 0.6 can suppress a reflectivity of a substrate to 1% or less with an optimum thickness of an intermediate resist layer even when a thickness of the bottom resist layer is thin of 100 nm or less. And a thinner thickness of a resist layer can be realized because of its high etching resistance.

As described above, a bottom resist layer which has a higher etching resistance during etching a substrate and proper k value to be able to suppress a reflectivity of a substrate even when a thickness of an intermediate resist layer is thin is needed in a trilayer resist process.

Furthermore, when a processed layer to be an underlayer of resist layers is a low dielectric constant insulator film comprising porous silica, there is a problem called poisoning that footing profile occurs or scum is generated in a space portion. The poisoning is considered to occur as follows: porous silica adsorbs ammonia in cleaning process of a substrate in which ammonia is used, ammonia is liberated in a resist process, and the ammonia neutralizes acid in resist generated in an exposed area.

Against such a problem, a bottom resist layer that has a high poisoning-resistant effect in a porous silica insulator film after cleaning of a substrate is needed.

SUMMARY OF THE INVENTION

The present invention has been made in order to solve such problems. The object of the present invention is to provide a bottom resist layer composition which has a higher etching resistance during etching a substrate than polyhydroxy styrene, cresol novolac resin, etc., shows an antireflection effect against an exposure light by combining with an intermediate resist layer having an antireflection effect if necessary, has a high poisoning-resistant effect, and is suitable for using in a multilayer-resist process like a bilayer resist process or a trilayer resist process.

To achieve the above mentioned object, the present invention provides a bottom resist layer composition for a multilayer-resist film used in lithography which comprises, at least, a polymer having a repeating unit represented by the following general formula (1),

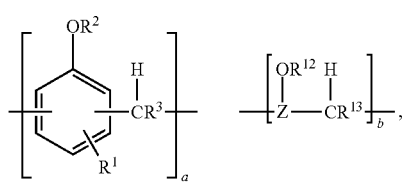

(1)

wherein $R^1$ represents any one of a hydrogen atom, a linear, branched or cyclic alkyl group having 1-10 carbon atoms, an aryl group having 6-10 carbon atoms, a linear, branched or cyclic alkenyl group having 2-10 carbon atoms, and a halogen atom, $R^2$ and $R^{12}$ independently represent any one of a hydrogen atom, a linear, branched or cyclic alkyl group having 1-6 carbon atoms, a linear, branched or cyclic alkenyl group having 2-6 carbon atoms, an aryl group having 6-10 carbon atoms, an acyl group or an alkoxy carbonyl group having 1-10 carbon atoms, a group forming an acetal group with an oxygen atom bonded with $R^2$ or $R^{12}$ in the above general formula (1), and a glycidyl group, $R^3$ and $R^{13}$ independently represent any one of a hydrogen atom, a linear, branched or cyclic alkyl group having 1-10 carbon atoms, and an aryl group having 6-10 carbon atoms, a and b satisfy 0<a<1, 0<b<1, and 0<a+b≦1, and Z represents fused polycyclichydrocarbon which may have hetero atoms.

The bottom resist layer composition which comprises, at least, a polymer having a repeating unit represented by the above general formula (1) has a high etching resistance during etching a substrate and has a high poisoning-resistant effect.

And, an excellent resist pattern profile after development can be obtained by using such a bottom resist layer composition.

In this case, it is preferable that the multilayer-resist film is a trilayer resist film comprising a bottom resist layer formed on a substrate, an intermediate resist layer containing silicon atoms formed on the bottom resist layer, and a top resist layer of a photoresist composition formed on the intermediate resist layer.

If the bottom resist layer composition of the present invention is used in a trilayer resist process, an excellent antireflection effect against an exposure light can be obtained by combining with an intermediate resist layer having an antireflection effect, thereby pattern with higher resolution can be formed.

And, it is preferable that the bottom resist layer composition of the present invention further contains any one of or more of a cross-linker, an acid generator and an organic solvent.

As mentioned above, if the bottom resist layer composition of the present invention further contains any one of or more of a cross-linker, an acid generator and an organic solvent, cross linking reaction in a bottom resist layer can be promoted by baking after application to a substrate etc., and an application property to a substrate etc. can be improved. Therefore, a bottom resist layer made of such a composition has an excellent uniformity. And there is little possibility to intermix with a top resist layer or an intermediate resist layer, and low molecular components hardly diffuse to the top resist layer etc.

Furthermore, the present invention provides a patterning process on a substrate with lithography wherein, at least, a bottom resist layer is formed on a substrate with the bottom resist layer composition according to the present invention, an intermediate resist layer containing silicon atoms is formed on the bottom resist layer, a top resist layer of a photoresist composition is formed on the intermediate resist layer, to form a trilayer resist film, a pattern circuit area of the trilayer resist film is exposed and developed with a developer to form a resist pattern on the top resist layer, the intermediate resist layer is etched using as a mask the top resist layer on which the pattern is formed, the bottom resist layer is etched using as a mask at least the intermediate resist layer on which the pattern is formed, and then the substrate is etched using as a mask at least the bottom resist layer on which the pattern is formed, to form the pattern on the substrate.

As mentioned above, the bottom resist layer formed by using the bottom resist layer composition of the present invention has a particularly excellent etching resistance during etching a substrate, brings an excellent antireflection effect by combining with an intermediate resist layer having an antireflection effect if necessary, and has a high poisoning-resistant effect. Therefore, if it is used as a bottom resist layer of a trilayer resist process, a pattern can be formed on a substrate with higher precision.

In this case, it is possible that the top resist layer does not contain silicon atoms, and the etching of the bottom resist layer using the intermediate resist layer as a mask is carried out with dry etching using a gas mainly containing oxygen gas.

A top resist layer without containing silicon atoms has the benefit of being more excellent in resolution than a top resist layer containing silicon atoms. Therefore, a pattern transferred to an intermediate resist layer and even a pattern transferred to a bottom resist layer with dry etching using a gas mainly containing oxygen gas using the intermediate resist layer as a mask can be excellent in precision. Accordingly, a substrate is etched using as a mask the bottom resist layer on which the pattern is transferred to form a pattern on the substrate, thereby a pattern can be formed on the substrate with higher precision.

It is possible that the pattern circuit area is exposed with ArF excimer laser at a wavelength of 193 nm or KrF excimer laser at a wavelength of 248 nm.

The bottom resist layer composition of the present invention can be suitably used for a patterning process in which the pattern circuit area is exposed with ArF excimer laser at a wavelength of 193 nm or KrF excimer laser at a wavelength of 248 nm, thereby a pattern can be formed with higher precision.

As mentioned above, according to the present invention, a bottom resist layer composition having those characteristics as follows can be obtained. An etching rate during etching with $CF_4/CHF_3$ gas, $Cl_2/BCl_3$ gas, etc. used for processing a substrate is slower than that of polyhydroxy styrene, cresol novolac resin, etc., namely, the composition has an excellent etching resistance during etching a substrate. And the composition brings an excellent antireflection effect against an exposure light by combining with an intermediate resist layer having an antireflection effect if necessary. Furthermore an excellent resist pattern profile after development can be also obtained. The composition has a high poisoning-resistant effect, and is suitable for using in a multilayer-resist process, in particular, a trilayer resist process.

BRIEF DESCRIPTION OF THE DRAWINGS

FIG. 6 is an explanatory view of an example of a patterning process of the present invention in a trilayer resist process.

DESCRIPTION OF THE INVENTION AND A PREFERRED EMBODIMENT

Figure 1:
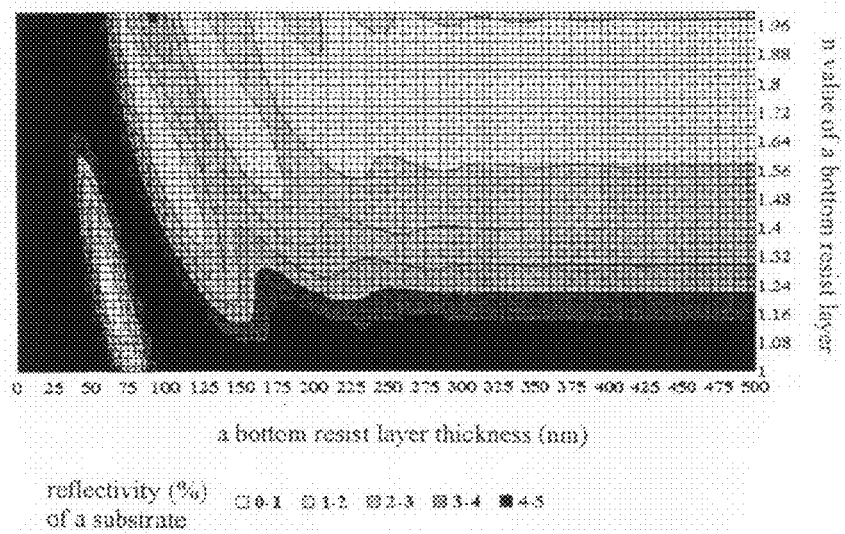
FIG. 1 is a graph which shows the relation between a thickness of a bottom resist layer and reflectivity of a substrate in a bilayer-resist process when refractive index k value of the bottom resist layer is fixed at 0.3, and a refractive index n value of the bottom resist layer is changed in a range of 1.0 to 2.0 (exposure wavelength is 193 nm, the n value of a top resist layer is 1.74, and the k value thereof is 0.02).
Figure 2:
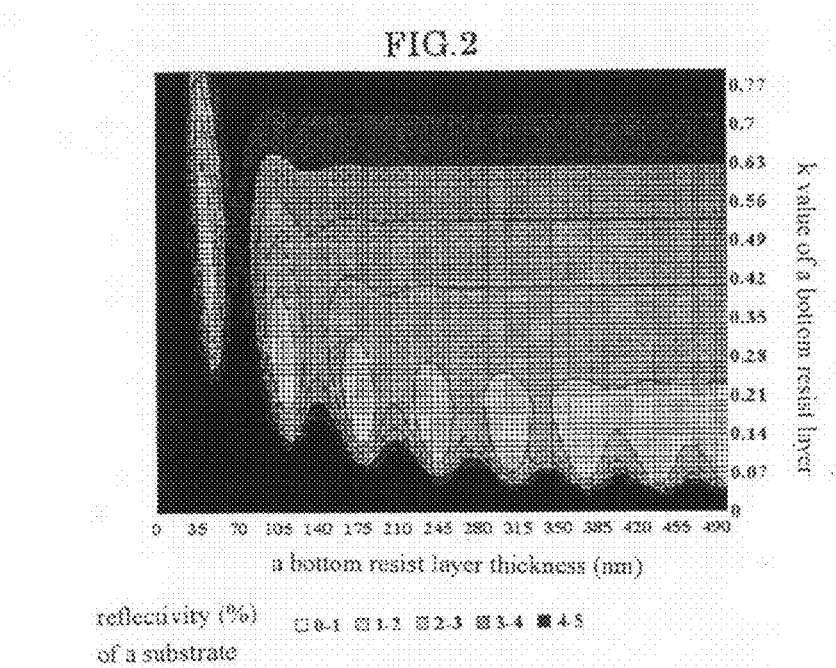
FIG. 2 is a graph which shows the relation between a thickness of a bottom resist layer and reflectivity of a substrate in a bilayer-resist process when a refractive index n value of the bottom resist layer is fixed at 1.5, and the k value of the bottom resist layer is changed in a range of 0 to 0.8 (exposure wavelength is 193 nm, the n value of a top resist layer is 1.74, and the k value thereof is 0.02).
Figure 3:
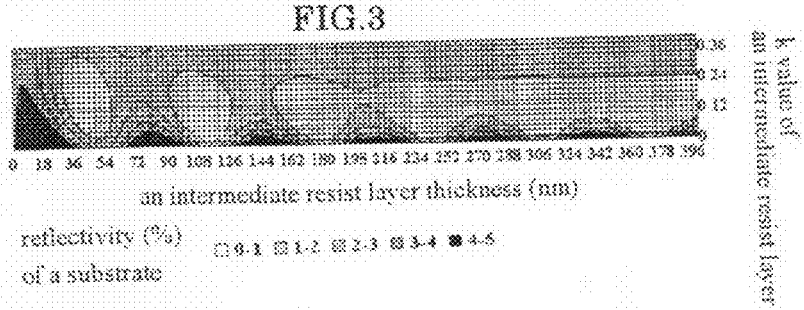
FIG. 3 is a graph which shows fluctuation of reflectivity of a substrate in a trilayer-resist process when a refractive index n value of a bottom resist layer is fixed at 1.5, k value of the bottom resist layer is fixed at 0.6, a thickness of the bottom resist layer is fixed at 500 nm, a refractive index n value of an intermediate resist layer is fixed at 1.5, k value of the intermediate resist layer is changed in a range of 0 to 0.4, and a thickness of the intermediate resist layer is changed in a range of 0 to 400 nm.
Figure 4:
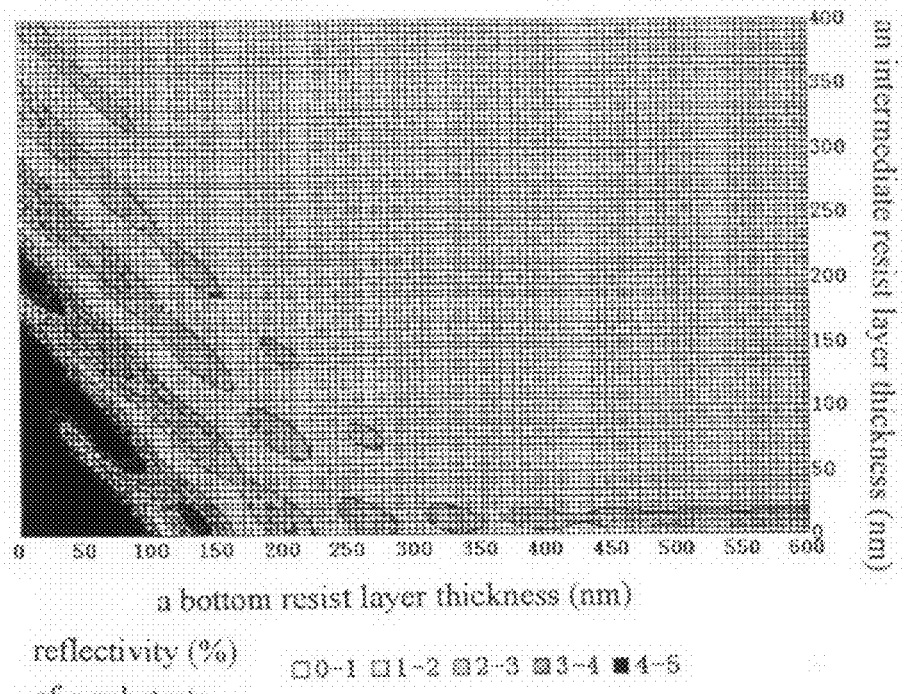
FIG. 4 is a graph which shows fluctuation of reflectivity of a substrate in a trilayer-resist process when a refractive index n value of a bottom resist layer is fixed at 1.5, k value of the bottom resist layer is fixed at 0.2, a refractive index n value of an intermediate resist layer is fixed at 1.5, k value of the intermediate resist layer is fixed at 0.1, and a thickness of the bottom resist layer and the intermediate resist layer is changed.
Figure 5:
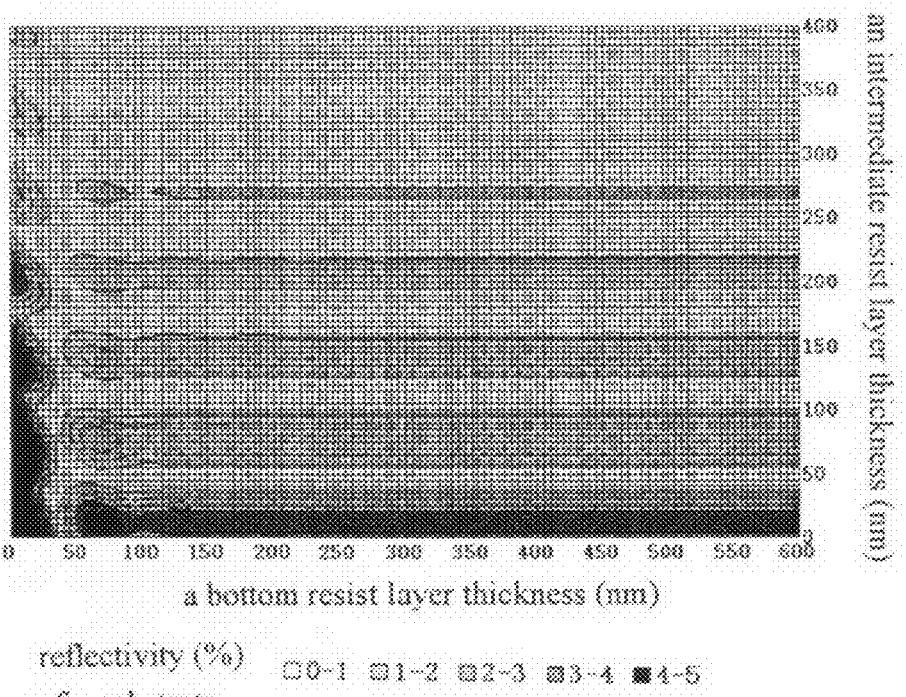
FIG. 5 is a graph which shows fluctuation of reflectivity of a substrate in a trilayer-resist process when a refractive index n value of a bottom resist layer is fixed at 1.5, k value of the bottom resist layer is fixed at 0.6, a refractive index n value of an intermediate resist layer is fixed at 1.5, k value of the intermediate resist layer is fixed at 0.1, and a thickness of the bottom resist layer and the intermediate resist layer is changed.

Hereafter, a preferred embodiment of the present invention will be explained. However, the present invention is not limited thereto.

As mentioned above, in particular, in a bottom resist layer of a trilayer resist process, a high etching resistance during etching a substrate is needed rather than an effect as an anti reflection film. Therefore, it is preferable to use novolac resin that has a high etching resistance and many aromatic groups as a bottom resist layer of a trilayer resist process. For example, novolac resins obtained from condensed hydrocarbon like naphthol, hydroxy anthracene, etc. has been suggested (for example, see Japanese Patent Application Laid-open (KOKAI) No. 2002-14474). In addition, a patterning process of a trilayer resist process using a bottom resist layer like polyarylene resin, naphthol novolac, hydroxy anthracene novolac, etc. whose carbon ratio is 80 wt % or more has been suggested (for example, see Japanese Patent Application Laid-open (KOKAI) No. 2002-305187).

As mentioned above, an etching resistance can be improved by using novolac resins obtained from condensed hydrocarbon like naphthol, hydroxy anthracene, etc. that has high carbon density and a high etching resistance as a bottom resist layer composition. However, according to investigations by the present inventors, molecular weight of a novolac resin consisting of only 1-naphthol is low. And, a mass average molecular weight thereof measured with gel permeation chromatography relative to polystyrene standards is about 1,000, and a large amount of low molecular compounds like monomer, oligomer, etc. that did not react are existing. When it comes to condensed polycyclic hydrocarbon having more carbon atoms than 1-hydroxy anthracene, polymerization reaction hardly progresses with the hydrocarbon alone. As mentioned above, when a large amount of low molecular compounds remain in a bottom resist layer composition, it has been found that there is problems in which the compounds volatilize during baking after spin-coating to contaminate coatercup, or uniformity of a film thickness is deteriorated.

The inventors of the present invention have investigated further, and have found that condensed hydrocarbon with a hydroxyl group can increase molecular weight thereof by condensation polymerization with phenols, and thus-obtained polymer can be preferably used as a bottom resist layer. Thus, they accomplished the present invention. As mentioned above, a rate of reaction in which condensed hydrocarbon becomes a novolac resin can be faster by condensation polymerization with phenols, and a bottom resist layer composition that can form a bottom resist layer with a high uniformity by spin-coating having a high etching resistance and excellent embedding characteristics in a nonplanar substrate, a via hole, etc. can be obtained.

Namely, the present invention provides a bottom resist layer composition for a multilayer-resist film used in lithography which comprises, at least, a polymer having a repeating unit represented by the following general formula (1),

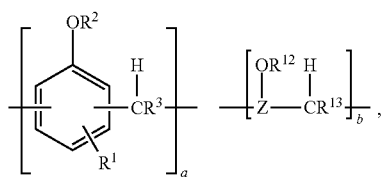

(1)

, wherein $R^1$ represents any one of a hydrogen atom, a linear, branched or cyclic alkyl group having 1-10 carbon atoms, an aryl group having 6-10 carbon atoms, a linear, branched or cyclic alkenyl group having 2-10 carbon atoms, and a halogen atom, $R^2$ and $R^{12}$ independently represent any one of a hydrogen atom, a linear, branched or cyclic alkyl group having 1-6 carbon atoms, a linear, branched or cyclic alkenyl group having 2-6 carbon atoms, an aryl group having 6-10 carbon atoms, an acyl group or an alkoxy carbonyl group having 1-10 carbon atoms, a group forming an acetal group with an oxygen atom bonded with $R^2$ or $R^{12}$ in the above general formula (1), and a glycidyl group, $R^3$ and $R^{13}$ independently represent any one of a hydrogen atom, a linear, branched or cyclic alkyl group having 1-10 carbon atoms, and an aryl group having 6-10 carbon atoms, a and b satisfy 0<a<1, 0<b<1, and 0<a+b≦1, and Z represents fused polycyclichydrocarbon which may have hetero atoms like a sulfur atom.

The polymer according to the present invention comprising repeating units a and b in the above general formula (1) may comprise one type of a and b respectively, or may comprise two or more types of a and/or b.

By using such a bottom resist layer composition, a bottom resist layer which has high carbon density and an extremely high dry etching resistance during processing a substrate can be obtained.

In addition, such a bottom resist layer composition can be used for a multilayer-resist process like a bilayer resist process or a trilayer resist process, in particular, preferably for a trilayer resist process. In a trilayer resist process a reflectivity of a substrate can be suppressed to 1% or less by combining a bottom resist layer with an intermediate resist layer having an antireflection effect if necessary.

And, a bottom resist layer formed with such a bottom resist layer composition is excellent in film denseness and ammonia gas can be shielded sufficiently, thereby generation of poisoning can be prevented.

Furthermore, such a bottom resist layer can be preferably used for exposure with a high energy beam particularly at a wavelength of 300 nm or less, in particular, excimer laser light of 248 nm or 193 nm, etc.

A synthetic process of a bottom resist layer composition of the present invention is not limited. However, for example, as described above, it can be obtained by condensation polymerization of condensed hydrocarbon having a hydroxyl group with phenols.

Examples of the phenols used in this condensation polymerization may include: phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethyl phenol, 3,4,5-trimethyl phenol, 2-t-butyl-phenol, 3-t-butyl-phenol, 4-t-butyl-phenol, 2-phenyl-phenol, 3-phenyl-phenol, 4-phenyl-phenol, 3,5-diphenyl-phenol, 2-naphthylphenol, 3-naphthylphenol, 4-naphthylphenol, 4-tritylphenol, 4-vinylphenol, 4-propynylphenol, 4-allylphenol, 4-ethinylphenol, resorcinol, 2-methyl resorcinol, 4-methyl resorcinol, 5-methyl resorcinol, catechol, 4-t-butyl-catechol, 2-methoxy phenol, 3-methoxy phenol, 2-propyl phenol, 3-propyl phenol, 4-propyl phenol, 2-isopropyl phenol, 3-isopropyl phenol, 4-isopropyl phenol, 2-cyclohexylphenol, 3-cyclohexylphenol, 4-cyclohexylphenol, 2-methoxy-5-methyl phenol, 2-t-butyl-5-methyl phenol, pyrogallol, thymol, isothymol, etc.

In addition, condensed hydrocarbon having a hydroxyl group used in the above condensation polymerization may include: 1-naphthol, 2-naphthol, 2-methyl-1-naphthol, 4-methoxy-1-naphthol, 7-methoxy-2-naphthol and dihydroxy naphthalene such as 1,5-dihydroxy naphthalene, 1,7-dihydroxy naphthalene, 2,6-dihydroxy naphthalene, etc., hydroxy indene, hydroxy benzothiophene, hydroxy anthracene, hydroxy acenaphthylene, hydroxy pyrene, hydroxy fluorene, hydroxy phenanthrene, hydroxy azulene, hydroxy heptalene, hydroxy biphenylene, hydroxy indacene, hydroxy fluoracene, hydroxy naphthacene, hydroxy aceanthrylene, hydroxy perylene, etc.

In the above general formula (1), a polymer with $R^2$ and $R^{12}$ of a glycidyl group can be obtained by turning a phenolic hydroxyl group of novolac according to the above general formula (1) into a glycidyl group according to a conventional method using epichlorohydrin. In addition, a polymer with $R^2$ and $R^{12}$ forming an acetal group with an oxygen atom bonded with $R^2$ or $R^{12}$ can be obtained by reacting a phenolic hydroxyl group of novolac according to the above general formula (1) with alkenyl ether compounds in the presence of acid catalyst, or by using halogenated alkyl ether compounds to protect a phenolic hydroxyl group by an alkoxy alkyl group in the presence of base. And, a polymer with $R^2$ and $R^{12}$ of an acyl group can be obtained by reacting a phenolic hydroxyl group of novolac according to the above general formula (1) with alkyl carbonyl chloride. Furthermore, a polymer with $R^2$ and $R^{12}$ of an alkoxy carbonyl group can be obtained by reacting a phenolic hydroxyl group of novolac according to the above general formula (1) with dialkyl dicarbonate or alkoxy carbonyl alkyl halide.

In synthetic reaction of novolac resin, condensation reaction is carried out with adding aldehyde to above-mentioned condensed hydrocarbon and phenols. Aldehydes used in the synthetic reaction of novolac resin may include: formaldehyde, trioxane, paraformaldehyde, benzaldehyde, acetaldehyde, propylaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, furfural, etc. Among these, in particular, formaldehyde can be preferably used.

These aldehydes may be used alone or in admixture.

An amount of the aldehyde to be used is preferably 0.2 to 5 moles per 1 mole of above-mentioned condensed hydrocarbon and phenols, more preferably 0.5 to 2 moles.

In addition, catalyst can be used in the above-mentioned synthetic reaction of novolac resin.

For example, the catalyst may include: acid catalyst like hydrochloric acid, nitric acid, sulfuric acid, formic acid, oxalic acid, acetic acid, methansulfonic acid, camphor sulfonic acid, tosyl acid, trifluoromethane sulfonic acid, etc.

An amount of the acid catalyst to be used is $1\times10^{-5}$ to $5\times10^{-1}$ moles per 1 mole of above-mentioned condensed hydrocarbon and phenols.

A reaction solvent in such a condensation polymerization may include: water, methanol, ethanol, propanol, butanol, tetrahydrofuran, dioxane, admixture thereof, etc. These solvents can be preferably used, for example, in a range of 0 to 2000 parts by mass per 100 parts by mass of reaction materials.

Although reaction temperature can be selected properly according to reactivity of reaction materials, it is generally in a range of 10 to 20° C.

In addition, in a process of condensation polymerization, for example, the above-mentioned condensed hydrocarbon, phenols, aldehydes and catalyst may be added at a time, or the above-mentioned condensed hydrocarbon, phenols and aldehydes may be added dropwise in the presence of catalyst.

After termination of the above-mentioned condensation polymerization reaction, in order to remove unreacted materials, catalyst, etc. in a system, temperature of a reactor can be elevated to 130 to 230° C. to remove devolatilize at about 1 to 50 mmHg.

In addition, in the above-mentioned condensation polymerization reaction, one type of condensed hydrocarbon having a hydroxyl group may be reacted with one type of phenol, or condensed hydrocarbon and/or phenol may be two types or more.

Copolymerization ratio of a polymer represented in the above general formula (1) is $0<a<1$ and $0<b<1$, preferably $0.2 \leq a \leq 0.99$, $0.01 \leq b \leq 0.7$, more preferably $0.3 \leq a \leq 0.98$, $0.02 \leq b \leq 0.6$.

As for molecular weight of the polymer of the present invention relative to polystyrene standards, mass average-molecular-weight (Mw) is preferably 1,000 to 30,000, in particular, 2,000 to 20,000. Molecular-weight distribution thereof is preferably in a range of 1.2 to 7. And, if monomer, oligomer or low-molecular components with molecular weight (Mw) of 1,000 or less is removed, to narrow molecular-weight distribution, efficiency of crosslink increases, and contamination around bakecup can be prevented by suppressing volatile components during baking.

In addition, hydrogenation can be carried out in order to raise a transparency of a polymer having a repeating unit represented by the general formula (1) of the present invention at a wavelength of 193 nm. A desirable ratio of hydrogenation is 80 mole % or less of an aromatic group, in particular, 60 mole % or less.

Furthermore, other polymers can be blended with the polymer of the present invention. Blend polymers are mixed with the polymer of the general formula (1) to play a role to improve film deposition characteristics in spin coating and embedding characteristics in a nonplanar substrate. As a blend polymer, materials with high carbon density and high etching resistance is selected. For example, such a material may include: phenol, o-cresol, m-cresol, p-cresol, 2,3-dimethylphenol, 2,5-dimethylphenol, 3,4-dimethylphenol, 3,5-dimethylphenol, 2,4-dimethylphenol, 2,6-dimethylphenol, 2,3,5-trimethyl phenol, 3,4,5-trimethyl phenol, 2-t-butyl-phenol, 3-t-butyl-phenol, 4-t-butyl-phenol, 2-phenyl-phenol, 3-phenyl-phenol, 4-phenyl-phenol, 3,5-diphenyl-phenol, 2-naphthylphenol, 3-naphthylphenol, 4-naphthylphenol, 4-tritylphenol, resorcinol, 2-methyl resorcinol, 4-methyl resorcinol, 5-methyl resorcinol, catechol, 4-t-butyl-catechol, 2-methoxy phenol, 3-methoxy phenol, 2-propyl phenol, 3-propyl phenol, 4-propyl phenol, 2-isopropyl phenol, 3-isopropyl phenol, 4-isopropyl phenol, 2-methoxy-5-methyl phenol, 2-t-butyl-5-methyl phenol, pyrogallol, thymol, isothymol, 4,4'-(9H-fluorene-9-ylidene)bisphenol, 2,2'-dimethyl-4,4'-(9H-fluorene-9-ylidene)bisphenol, 2,2'-diallyl-4,4'-(9H-fluorene-9-ylidene)bisphenol, 2,2'-difluoro-4,4'-(9H-fluorene-9-ylidene)bisphenol, 2,2'-diphenyl-4,4'-(9H-fluorene-9-ylidene)bisphenol, 2,2'-dimethoxy-4,4'-(9H-fluorene-9-ylidene)bisphenol, 2,3,2',3'-tetrahydro-(1,1')-spirobiindene-6,6'-diol, 3,3,3',3'-tetramethyl-2,3,2',3'-tetrahydro-(1,1')-spirobiindene-6,6'-diol, 3,3,3',3',4,4'-hexamethyl-2,3,2',3'-tetrahydro-(1,1')-spirobiindene-6,6'-diol, 2,3,2',3'-tetrahydro-(1,1')-spirobiindene-5,5'-diol, 5,5'-dimethyl-3,3,3',3'-tetramethyl-2,3,2',3'-tetrahydro-(1,1')-spirobiindene-6,6'-diol, 1-naphthol, 2-naphthol, 2-methyl-1-naphthol, 4-methoxy-1-naphthol, 7-methoxy-2-naphthol, dihydroxy naphthalene such as 1,5-dihydroxy naphthalene, 1,7-dihydroxy naphthalene, 2,6-dihydroxy naphthalene, etc., a novolac resin of 3-hydroxy-naphthalene-2-methyl carboxylate, indene, hydroxy indene, benzofuran, hydroxy anthracene, acenaphthylene, biphenyl, bisphenol, tris phenol, dicyclopentadiene, tetrahydro indene, 4-vinyl cyclohexene, norbornadiene, 5-vinyl-norborna-2-en, α-pinene, β-pinene, limonene, etc., polyhydroxy styrene, polystyrene, polyvinyl naphthalene, polyvinyl anthracene, polyvinyl carbazole, polyindene, poly acenaphthylene, poly norbornene, poly cyclodecene, poly tetracyclododecene, polynortricyclene, poly(meth)acrylate, and copolymer thereof.

An amount of the blend polymers to be added is 0 to 1,000 parts by mass per 100 parts by mass of a polymer represented by the general formula (1), preferably 0 to 500 parts by mass.

One of the properties required for bottom layers including antireflection layers is that the layer does not intermix with an upper layer, for example, an intermediate layer containing silicon and a resist layer, and low molecular components hardly diffuse to the upper layer from the bottom layer [See Proc. SPIE Vol. 2195, p 225-229 (1994)]. In order to prevent intermixing and diffusing, a method to carry out thermal crosslinking by baking after an antireflection layer is spin-coated is generally adopted. Therefore, when a cross-linker can be added as a component of an antireflection layer composition, a substituent which can carry out crosslinking can be introduced into a polymer. Even in the case of not adding a cross-linker particularly, if $R^2$ or $R^{12}$ represents a hydrogen atom in the above general formula (1), the polymer can be cross-linked by heating of 300° C. or more to induce condensation reaction of hydroxyl groups.

If the bottom resist layer composition explained above further contains a cross-linker, an acid generator, an organic solvent, etc., an application property of the composition to a substrate etc. can be improved, and cross linking reaction in a bottom resist layer can be promoted by baking etc. after application of the composition. Therefore, such a bottom resist layer has an excellent uniformity. And there is little possibility to intermix with a top resist layer, and low molecular components hardly diffuse to the top resist layer. And, the bottom resist layer has an excellent rigidity and solvent-resistant property.

Hereafter, these compounds are detailed.

Examples of the cross-linker which can be used according to the present invention may include: a melamine compound, a guanamine compound, a glycol uryl compound or an urea compound substituted with at least one group chosen from a methylol group, an alkoxy methyl group and an acyloxy methyl group, an epoxy compound, an isocyanate compound, an azide compound, a compound including a double bond such as an alkenyl ether group, etc. Although they may be used as an additive, they can be introduced into a polymer side chain as a pendant group. Moreover, a compound containing a hydroxy group can also be used as a cross-linker.

Examples of the epoxy compound among the above-mentioned specific examples of the cross-linker may include: tris(2,3-epoxypropyl)isocyanurate, trimethylol methanetriglycidyl ether, trimethylol propane triglycidyl ether, triethylol ethanetriglycidyl ether, etc. Examples of the melamine compound may include: hexamethylol melamine, hexamethoxy methyl melamine, a compound in which 1-6 methylol groups of hexamethylol melamine are methoxy methylated or a mixture thereof, hexamethoxy ethyl melamine, hexaacyloxy methyl melamine, a compound in which 1-6 methylol groups of hexamethylol melamine are acyloxy methylated or a mixture thereof, etc. Examples of a guanamine compound may include: tetramethylol guanamine, tetra methoxy methyl guanamine, a compound in which 1-4 methylol groups of tetramethylol guanamine are methoxy-methylated and a mixture thereof, tetramethoxy ethyl guanamine, tetraacyloxy guanamine, a compound in which 1-4 methylol groups of tetramethylol guanamine are acyloxy-methylated and a mixture thereof, etc. Examples of a glycol uryl compound may include: tetramethylol glycol uryl, tetramethoxy glycol uryl, tetramethoxy methyl-glycol uryl, a compound in which 1-4 methylol groups of tetramethylol glycol uryl are methoxy methylated or a mixture thereof, and a compound in which 1-4 methylol group of tetramethylol glycol uryl are acyloxy methylated or a mixture thereof, etc. Examples of a urea compound may include: tetra methylol urea, tetra methoxy methyl urea, a compound in which 1-4 methylol groups of tetra methylol urea are methoxy-methylated or a mixture thereof, and tetra methoxy ethyl urea, etc.

Examples of the isocyanate compound may include: tolylene diisocyanate, diphenyl methane diisocyanate, hexamethylene diisocyanate, cyclohexane diisocyanate, etc. Examples of the azide compound may include: 1,1'-biphenyl-4,4'-bisazide, 4,4'-methylidene bisazide, and 4,4'-oxybisazide, etc.

Examples of the compound containing an alkenyl ether group may include: ethylene glycol divinyl ether, triethyleneglycol divinyl ether, 1,2-propanediol divinyl ether, 1,4-butanediol divinyl ether, tetramethylene-glycol divinyl ether, neo pentyl glycol divinyl ether, trimethylol-propane trivinyl ether, hexane diol divinyl ether, 1,4-cyclohexane diol divinyl ether, pentaerythritol trivinyl ether, pentaerythritol tetra vinyl ether, sorbitol tetra vinyl ether, sorbitol penta vinyl ether, and trimethylol-propane trivinyl ether, etc.

A compound in which a hydroxy group of an alcoholic-group-containing compound is turned into a glycidyl ether group by epichlorohydrin can be used as a cross-linker. The alcoholic-group-containing compound may include: naphthol novolac, m- and p-cresol novolac, naphthol dicyclopentadiene novolac, m- and p-cresol dicyclopentadiene novolac, 4,8-bis(hydroxymethyl)tricyclo[5.2.1.0$^{2,6}$]-decane, pentaerythritol, 1,2,6-hexanetriol, 4,4',4"-methylidene tris cyclohexanol, 4,4'-[1-[4-[1-(4-hydroxy cyclohexyl)-1-methylethyl]phenyl]ethylidene]biscyclohexanol, [1,1'-bicyclohexyl]-4,4'-diol, methylene biscyclohexanol, decahydro naphthalene-2,6-diol, and [1,1'-bicyclohexyl]-3, 3',4,4'-tetrahydroxy, etc. And a compound in which a hydroxy group of a phenol containing less benzene nuclei is turned into a glycidyl ether group by epichlorohydrin can be used as a cross-linker. The phenol containing less benzene nuclei may include: bisphenol, methylene bisphenol, 2,2'-methylene bis [4-methyl phenol], 4,4'-methylidene-bis[2,6-dimethylphenol], 4,4'-(1-methyl-ethylidene)bis[2-methyl phenol], 4,4'-cyclohexylidene bisphenol, 4,4'-(1,3-dimethyl butylidene) bisphenol, 4,4'-(1-methyl-ethylidene)bis[2,6-dimethyl phenol], 4,4'-oxybisphenol, 4,4'-methylene bisphenol, bis(4-hydroxyphenyl)methanone, 4,4'-methylene bis[2-methylphenol], 4,4'-[1,4-phenylene bis(1-methyl ethylidene)] bisphenol, 4,4'-(1,2-ethane-di-yl) bisphenol, 4,4'-(diethyl silylene)bisphenol, 4,4'-[2,2,2-trifluoro-1-(trifluoromethyl) ethylidene]bisphenol, 4,4',4"-methylidene trisphenol, 4,4'-[1-(4-hydroxyphenyl)-1-methylethyl]phenyl]ethylidene] bisphenol, 2,6-bis[(2-hydroxy-5-methylphenyl)methyl]-4-methyl phenol, 4,4',4"-ethylidyne tris[2-methyl phenol], 4,4', 4"-ethylidyne trisphenol, 4,6-bis[(4-hydroxy phenyl)methyl] 1,3-benzene diol, 4,4'-[(3,4-dihydroxy phenyl)methylene]bis [2-methylphenol], 4,4',4",4"'-(1,2-ethanediylidene) tetrakisphenol, 4,4',4",4"'-ethanediylidene tetrakis[2-methylphenol], 2,2'-methylene bis[6-[(2-hydroxy-5-methylphenyl)methyl]-4-methylphenol], 4,4',4",4"'-(1,4-phenylene dimethylidyne) tetrakisphenol, 2,4,6-tris(4-hydroxy phenylmethyl)-1,3-benzenediol, 2,4',4"-methylidene trisphenol, 4,4',4"'-(3-methyl-1-propanyl-3-ylidene)trisphenol, 2,6-bis[(4-hydroxy-3-phlorophenyl) methyl]-4-fluorophenol, 2,6-bis[4-hydroxy-3-fluorophenyl] methyl]-4-fluorophenol, 3,6-bis[(3,5-dimethyl-4-hydroxyphenyl)methyl]1,2-benzenediol, 4,6-bis[(3,5-dimethyl-4-hydroxy phenyl)methyl]1,3-benzenediol, p-methylcalics[4]allene, 2,2'-methylene bis[6-[(2,5/3,6-dimethyl-4/2-hydroxyphenyl)methyl]-4-methylphenol, 2,2'-methylene bis[6-[(3,5-dimethyl-4-hydroxyphenyl)methyl]-4-methyl phenol, 4,4',4",4"'-tetrakis[(1-methyl ethylidene)bis (1,4-cyclohexylidene)]-phenol, 6,6'-methylene bis[4-(4-hydroxy phenyl methyl)-1,2,3-benzentriol, and 3,3',5,5'-tetrakis[(5-methyl-2-hydroxyphenyl)methyl]-[(1,1'-biphenyl)-4,4'-diol], etc.

The amount of the cross-linker to be blended in the bottom resist layer composition of the present invention is preferably 0 to 50 parts (it means parts by mass hereafter), especially 0 to 40 parts per 100 parts of the base polymer (total resin). If it is 3 parts or more, there is little possibility that a bottom resist layer intermixes with a top resist layer or an intermediate resist layer. And if it is 50 parts or less, there is little possibility that antireflection effect may be deteriorated, a crack may be generated in the film after crosslinking, or etching resistance may be deteriorated due to low carbon density.

In a bottom resist layer composition of the present invention, an acid generator for promoting a crosslinking reaction by heat etc. can be further added. There are an acid generator which generates an acid by pyrolysis and an acid generator which generates an acid by optical irradiation, and either of the acid generator can be added.

Examples of the acid generator used in the bottom resist layer composition of the present invention are as follows:

i) an onium salt represented by the following general formulae (P1a-1), (P1a-2), (P1a-3) or (P1b), ii) a diazomethane derivative represented by the following general formula (P2), iii) a glyoxime derivative represented by the following general formula (P3), iv) a bis sulfone derivative represented by the following general formula (P4), v) a sulfonate of an N-hydroxy imide compound represented by the following general formula (P5), vi) a β-keto sulfonic-acid derivative, vii) a disulfone derivative, viii) a nitro benzyl sulfonate derivative, and ix) a sulfonate derivative, etc.

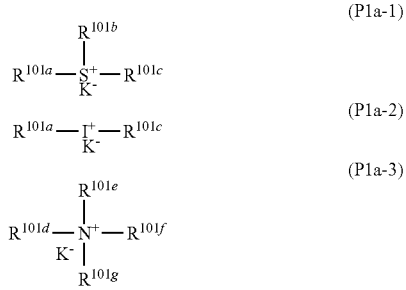

(In the formulae, $R^{101a}$, $R^{101b}$, and $R^{101c}$ independently represent a linear, branched or cyclic alkyl group, alkenyl group, oxoalkyl group or oxoalkenyl group each having 1-12 carbon atoms, an aryl group having 6-20 carbon atoms, an aralkyl group or an aryl oxoalkyl group having 7-12 carbon atoms. Some or all of hydrogen atoms of these groups may be substituted with an alkoxy group etc. $R^{101b}$ and $R^{101c}$ may constitute a ring. In the case that they constitute a ring, $R^{101b}$ and $R^{101c}$ represent an alkylene group having 1-6 carbon atoms respectively. $K^-$ represents a non-nucleophilic counter ion. $R^{101d}$, $R^{101e}$, $R^{101f}$ and $R^{101g}$ are represented by adding a hydrogen atom to $R^{101a}$, $R^{101b}$, and $R^{101c}$. $R^{101d}$ and $R^{101e}$, and $R^{101d}$, $R^{101e}$ and $R^{101f}$ can form a ring respectively. When they form a ring, $R^{101d}$ and $R^{101e}$, and $R^{101d}$, $R^{101e}$, and $R^{101f}$, represent an alkylene group having 3-10 carbon atoms or a heteroaromatic ring having the nitrogen atom in the formula in the ring.)

The above-mentioned $R^{101a}$, $R^{101b}$, $R^{101c}$, $R^{101d}$, $R^{101e}$, $R^{101f}$, and $R^{101g}$ may be the same or different. Examples thereof as an alkyl group may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cycloheptyl group, a cyclopropyl methyl group, 4-methyl cyclohexyl group, a cyclohexyl methyl group, a norbornyl group, and an adamantyl group, etc. Examples of an alkenyl group may include: a vinyl group, an allyl group, a propenyl group, a butenyl group, a hexenyl group, and a cyclohexenyl group, etc. Examples of an oxo alkyl group may include: 2-oxocyclopentyl group, 2-oxocyclohexyl group, 2-oxopropyl group, 2-cyclopentyl-2-oxoethyl group, 2-cyclohexyl-2-oxoethyl group, 2-(4-methylcyclohexyl)-2-oxoethyl group, etc. Examples of an oxoalkenyl group may include: 2-oxo-4-cyclohexenyl group, 2-oxo-4-propenyl group, etc. Examples of an aryl group may include: a phenyl group, a naphthyl group, etc., and an alkoxy phenyl group such as p-methoxyphenyl group, m-methoxyphenyl group, o-methoxyphenyl group, an ethoxyphenyl group, p-tert-butoxyphenyl group and m-tert-butoxy phenyl group, an alkyl phenyl group such as 2-methylphenyl group, 3-methylphenyl group, 4-methylphenyl group, an ethylphenyl group, 4-tert-butylphenyl group, 4-butylphenyl group, a dimethyl phenyl group, etc., an alkyl naphthyl group such as a methylnaphthyl group, an ethyl naphthyl group, etc., an alkoxy naphthyl group such as a methoxy naphthyl group, an ethoxy naphthyl group, etc., a dialkyl naphthyl group such as a dimethyl naphthyl group, a diethyl naphthyl group, etc., a dialkoxy naphthyl group such as a dimethoxy naphthyl group, a diethoxy naphthyl group, etc. Examples of the aralkyl group may include a benzyl group, a phenylethyl group, a phenethyl group, etc. Examples of an aryl oxoalkyl group may include: 2-aryl-2-oxoethyl group such as 2-phenyl-2-oxoethyl group, 2-(1-naphthyl)-2-oxoethyl group, 2-(2-naphthyl)-2-oxoethyl group, etc. Examples of a non-nucleophilic counter ion as $K^-$ may include: a halide ion such as a chloride ion, a bromide ion, etc., a fluoro alkyl sulfonate such as triflate, 1,1,1-trifluoro ethanesulfonate, nonafluoro butane sulfonate, etc., an aryl sulfonate such as tosylate, benzene sulfonate, 4-fluorobenzene sulfonate, 1,2,3,4,5-pentafluoro benzene sulfonate, etc., and an alkyl sulfonate such as mesylate, butane sulfonate, etc.

In addition, examples of a heteroaromatic ring that $R^{101d}$, $R^{101e}$, $R^{101f}$ and $R^{101g}$ have the nitrogen atom in the formula in the ring may include: an imidazole derivative (for example, imidazole, 4-methyl imidazole, 4-methyl-2-phenyl imidazole, etc.), a pyrazole derivative, a furazan derivative, a pyrroline derivative (for example, pyrroline, 2-methyl-1-pyrroline, etc.), a pyrrolidine derivative (for example, pyrrolidine, N-methylpyrrolidine, pyrrolidinone, N-methylpyrolidone, etc.), an imidazoline derivative, an imidazolidine derivative, a pyridine derivative (for example, pyridine, methylpyridine, ethyl pyridine, propyl pyridine, butyl pyridine, 4-(1-butyl pentyl)pyridine, dimethylpyridine, trimethylpyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridone, 4-pyrrolidino pyridine, 1-methyl-4-phenyl pyridine, 2-(1-ethylpropyl)pyridine, amino pyridine, dimethyl amino pyridine, etc.), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, etc.), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, 1,10-phenanthroline derivative, an adenine derivative, an adenosine derivative, a guanine derivative, a guanosine derivative, an uracil derivative, an uridine derivative, etc.

Although (P1a-1) and (P1a-2) have both effects of a photo acid generator and a thermal acid generator, (P1a-3) acts as a thermal acid generator.

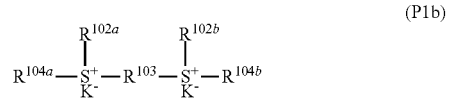

(P1b)

(In the formula, $R^{102a}$ and $R^{102b}$ each represents a linear, branched or cyclic alkyl group having 1-8 carbon atoms. $R^{103}$ represents a linear, branched or cyclic alkylene group having 1-10 carbon atoms. $R^{104a}$ and $R^{104b}$ each represents a 2-oxoalkyl group having 3-7 carbon atoms. $K^-$ represents a non-nucleophilic counter ion.)

Examples of the above-mentioned $R^{102a}$ and $R^{102b}$ may include: a methyl group, an ethyl group, a propyl group, an isopropyl group, n-butyl group, sec-butyl group, tert-butyl group, a pentyl group, a hexyl group, a heptyl group, an octyl group, a cyclopentyl group, a cyclohexyl group, a cyclopropylmethyl group, 4-methylcyclohexyl group, a cyclohexyl methyl group, etc. Examples of $R^{103}$ may include: a methylene group, an ethylene group, a propylene group, a butylene group, a pentylene group, a hexylene group, a heptylene group, an octylene group, a nonylene group, 1,4-cyclohexylene group, 1,2-cyclohexylene group, 1,3-cyclopentylene group, 1,4-cyclooctylene group, 1,4-cyclohexane dimethylene group, etc. Examples of $R^{104a}$ and $R^{104b}$ may include: 2-oxopropyl group, 2-oxocyclopentyl group, 2-oxocyclohexyl group, 2-oxocycloheptyl group, etc. As $K^-$, the same as mentioned in the formulae (P1a-1), (P1a-2) and (P1a-3) can be exemplified.

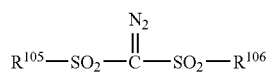

(P2)

(In the formula, $R^{105}$ and $R^{106}$ represent a linear, branched or cyclic alkyl group or a halogenated alkyl group having 1-12 carbon atoms, an aryl group or a halogenated aryl group having 6-20 carbon atoms, or an aralkyl group having 7-12 carbon atoms.)

Examples of an alkyl group as $R^{105}$ and $R^{106}$ may include: a methyl group, an ethyl group, a propyl group, an isopropyl group, n-butyl group, sec-butyl group, tert-butyl group, a pentyl group, a hexyl group, a heptyl group, an octyl group, an amyl group, a cyclopentyl group, a cyclohexyl group, a cycloheptyl group, a norbornyl group, an adamantyl group, etc. Examples of a halogenated alkyl group may include: trifluoromethyl group, 1,1,1-trifluoroethyl group, 1,1,1-trichloroethyl group, a nonafluoro butyl group, etc. Examples of an aryl group may include: a phenyl group, an alkoxyphenyl group such as p-methoxyphenyl group, m-methoxyphenyl group, o-methoxyphenyl group, an ethoxyphenyl group, p-tert-butoxyphenyl group, m-tert-butoxyphenyl group, etc. and an alkylphenyl group such as 2-methylphenyl group, 3-methylphenyl group, 4-methylphenyl group, an ethylphenyl group, 4-tert-butylphenyl group, 4-butylphenyl group, a dimethylphenyl group, etc. Examples of a halogenated aryl group may include: a fluorophenyl group, a chlorophenyl group, 1,2,3,4,5-pentafluoro phenyl group, etc. Examples of an aralkyl group may include: a benzyl group, a phenethyl group, etc.

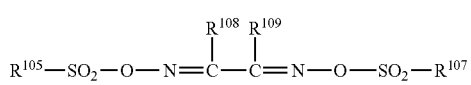

(P3)

(In the formula, $R^{107}$, $R^{108}$ and $R^{109}$ represent a linear, branched, cyclic alkyl group or halogenated alkyl group having 1-12 carbon atoms, an aryl group or a halogenated aryl group having 6-20 carbon atoms, or an aralkyl group having 7-12 carbon atoms. $R^{108}$ and $R^{109}$ may be bonded each other and form a cyclic structure. When they form a cyclic structure, $R^{108}$ and $R^{109}$ each represents a linear or branched alkylene group having 1-6 carbon atoms. $R^{105}$ represents the same group as that in the formula P2.)

Examples of the alkyl group, the halogenated alkyl group, the aryl group, the halogenated aryl group, and the aralkyl group as $R^{107}$, $R^{108}$ and $R^{109}$ may be the same as exemplified for $R^{105}$ and $R^{106}$. In addition, as an alkylene group for $R^{108}$ and $R^{109}$, a methylene group, an ethylene group, a propylene group, a butylene group, a hexylene group, etc. may be exemplified.

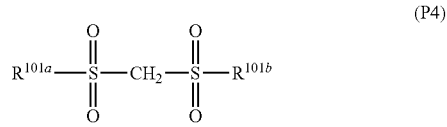

(P4)

(In the formula, $R^{101a}$ and $R^{101b}$ are the same as explained above.)

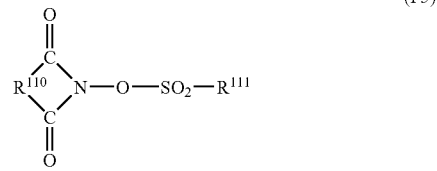

(P5)

(In the formula, $R^{110}$ represents an arylene group having 6-10 carbon atoms, an alkylene group having 1-6 carbon atoms or an alkenylene group having 2-6 carbon atoms. Some or all of hydrogen atoms of these groups may be further substituted with a linear or branched alkyl group or an alkoxy group having 1-4 carbon atoms, a nitro group, an acetyl group, or a phenyl group. $R^{111}$ represents a linear, branched or substituted alkyl group, alkenyl group or alkoxy alkyl group having 1-8 carbon atoms, a phenyl group or a naphthyl group. Some or all of hydrogen atoms of these groups may be substituted with an alkyl group or an alkoxy group having 1-4 carbon atoms; a phenyl group which may be substituted with an alkyl group or an alkoxy group having 1-4 carbon atoms, a nitro group or an acetyl group; a hetero aromatic group having 3-5 carbon atoms; or a chlorine atom or a fluorine atom.)

Examples of the arylene group as $R^{110}$ may include: 1,2-phenylene group, 1,8-naphthylene group, etc. Examples of the alkylene group may include: a methylene group, an ethylene group, a trimethylene group, a tetramethylene group, a phenylethylene group, a norbornane-2,3-di-yl group, etc. Examples of the alkenylene group may include: 1,2-vinylene group, 1-phenyl-1,2-vinylene group, 5-norbornene-2,3-di-yl group, etc. Examples of the alkyl group as $R^{111}$ may be the same as exemplified for $R^{101a}$-$R^{101c}$. Examples of the alkenyl group as $R^{111}$ may include: a vinyl group, a 1-propenyl group, an allyl group, a 1-butenyl group, a 3-butenyl group, an isoprenyl group, a 1-pentenyl group, a 3-pentenyl group, a 4-pentenyl group, a dimethyl allyl group, a 1-hexenyl group, a 3-hexenyl group, a 5-hexenyl group, a 1-heptenyl group, a 3-heptenyl group, a 6-heptenyl group, a 7-octenyl group, etc. Examples of the alkoxy alkyl group may include: a methoxy methyl group, an ethoxy methyl group, a propoxy methyl group, a butoxy methyl group, a pentyloxy methyl group, a hexyloxy methyl group, a heptyloxy methyl group, a methoxy ethyl group, an ethoxy ethyl group, a propoxy ethyl group, a butoxy ethyl group, a pentyloxy ethyl group, a hexyloxy ethyl group, a methoxy propyl group, an ethoxy propyl group, a propoxy propyl group, a butoxy propyl group, a methoxy butyl group, an ethoxy butyl group, a propoxy butyl group, a methoxy pentyl group, an ethoxy pentyl group, a methoxy hexyl group, a methoxy heptyl group, etc.

In addition, examples of the alkyl group having 1-4 carbon atoms which may be further substituted may include: a methyl group, an ethyl group, a propyl group, an isopropyl group, an n-butyl group, an isobutyl group, a tert-butyl group, etc. Examples of the alkoxy group having 1-4 carbon atoms may include: a methoxy group, an ethoxy group, a propoxy group, an isopropoxy group, an n-butoxy group, an isobutoxy group, a tert-butoxy group, etc. Examples of the phenyl group which may be substituted with an alkyl group and an alkoxy group having 1-4 carbon atoms, a nitro group or an acetyl group may include: a phenyl group, a tolyl group, a p-tert-butoxy phenyl group, a p-acetyl phenyl group, a p-nitrophenyl group, etc. Examples of a hetero aromatic group having 3-5 carbon atoms may include: a pyridyl group, a furil group, etc.

Examples of an acid generator may include: an onium salt such as tetramethyl ammonium trifluoromethane sulfonate, tetramethyl ammonium nonafluoro butane sulfonate, triethyl ammonium nonafluoro butane sulfonate, pyridinium nonafluoro butane sulfonate, triethyl ammonium camphor sulfonate, pyridinium camphor sulfonate, tetra n-butyl-ammonium nonafluoro butane sulfonate, tetraphenyl ammonium nonafluoro butane sulfonate, tetramethyl ammonium p-toluene sulfonate, diphenyl iodinium trifluoromethane sulfonate, (p-tert-butoxy phenyl)phenyl iodinium trifluoromethane sulfonate, diphenyl iodinium p-toluene sulfonate, (p-tert-butoxy phenyl)phenyl iodinium p-toluene sulfonate, triphenyl sulfonium trifluoromethane sulfonate, (p-tert-butoxy phenyl)diphenyl sulfonium trifluoromethane sulfonate, bis(p-tert-butoxy phenyl)phenyl sulfonium trifluoromethane sulfonate, tris(p-tert-butoxy phenyl)sulfonium trifluoromethane sulfonate, triphenyl sulfonium p-toluene sulfonate, (p-tert-butoxy phenyl)diphenyl sulfonium p-toluene sulfonate, bis(p-tert-butoxy phenyl)phenyl sulfonium p-toluene sulfonate, tris (p-tert-butoxy phenyl)sulfonium p-toluene sulfonate, triphenyl sulfonium nonafluoro butane sulfonate, triphenyl sulfonium butane sulfonate, trimethyl sulfonium trifluoromethane sulfonate, trimethyl sulfonium p-toluene sulfonate, cyclohexyl methyl (2-oxocyclohexyl)sulfonium trifluoromethane sulfonate, cyclohexyl methyl (2-oxo cyclohexyl)sulfonium p-toluene sulfonate, dimethyl phenyl sulfonium trifluoromethane sulfonate, dimethyl phenyl sulfonium p-toluene sulfonate, dicyclohexyl phenyl sulfonium trifluoromethane sulfonate, dicyclohexyl phenyl sulfonium p-toluene sulfonate, trinaphthylsulfonium trifluoromethane sulfonate, (2-norbonyl)methyl (2-oxocyclohexyl)sulfonium trifluoromethane sulfonate, ethylene bis[methyl (2-oxocyclopentyl)sulfonium trifluoromethane sulfonate], 1,2'-naphthyl carbonyl methyl-tetrahydro thiophenium triflate, etc.

Examples of a diazomethane derivative may include: bis(benzene sulfonyl)diazomethane, bis(p-toluene sulfonyl)diazomethane, bis(xylene sulfonyl)diazomethane, bis(cyclohexyl sulfonyl)diazomethane, bis(cyclopentyl sulfonyl)diazomethane, bis(n-butylsulfonyl)diazomethane, bis(isobutyl sulfonyl)diazomethane, bis(sec-butylsulfonyl)diazomethane, bis(n-propylsulfonyl)diazomethane, bis(isopropyl sulfonyl)diazomethane, bis(tert-butyl-sulfonyl)diazomethane, bis(n-amylsulfonyl)diazomethane, bis(isoamylsulfonyl)diazomethane, bis(sec-amylsulfonyl)diazomethane, bis(tert-amylsulfonyl)diazomethane, 1-cyclohexylsulfonyl-1-(tert-butyl-sulfonyl)diazomethane, 1-cyclohexyl sulfonyl-1-(tert-amyl sulfonyl)diazomethane, 1-tert-amyl sulfonyl-1-(tert-butyl-sulfonyl)diazomethane, etc.

Examples of a glyoxime derivative may include: bis-β-(p-toluene sulfonyl)-α-dimethylglyoxime, bis-O-(p-toluene sulfonyl)-α-diphenyl glyoxime, bis-O-(p-toluene sulfonyl)-α-dicyclohexyl glyoxime, bis-O-(p-toluene sulfonyl)-2,3-pentanedione glyoxime, bis-O-(p-toluene sulfonyl)-2-methyl-3,4-pentanedione glyoxime, bis-O-(n-butane sulfonyl)-α-dimethylglyoxime, bis-O-(n-butane sulfonyl)-α-diphenyl glyoxime, bis-O-(n-butane sulfonyl)-α-dicyclohexyl glyoxime, bis-O-(n-butane sulfonyl)-2,3-pentanedione glyoxime, bis-O-(n-butane sulfonyl)-2-methyl-3,4-pentanedione glyoxime, bis-O-(methane sulfonyl)-α-dimethylglyoxime, bis-O-(trifluoromethane sulfonyl)-α-dimethylglyoxime, bis-O-(1,1,1-trifluoro ethane sulfonyl)-α-dimethylglyoxime, bis-O-(tert-butane sulfonyl)-α-dimethylglyoxime, bis-O-(perfluoro octane sulfonyl)-α-dimethylglyoxime, bis-O-(cyclohexane sulfonyl)-α-dimethylglyoxime, bis-O-(benzene sulfonyl)-α-dimethylglyoxime, bis-O-(p-fluorobenzene sulfonyl)-α-dimethylglyoxime, bis-O-(p-tert-butylbenzene sulfonyl)-α-dimethylglyoxime, bis-O-(xylene sulfonyl)-α-dimethylglyoxime, bis-O-(camphor sulfonyl)-α-dimethylglyoxime, etc.

Examples of a bissulfone derivative may include: bis naphthyl sulfonyl methane, bis-trifluoro methyl sulfonyl methane, bis methyl sulfonyl methane, bis ethyl sulfonyl methane, bis propyl sulfonyl methane, bis isopropyl sulfonyl methane, bis-p-toluene sulfonyl methane, bis benzene sulfonyl methane, etc.

Examples of the β-ketosulfone derivative may include: 2-cyclohexyl carbonyl-2-(p-toluene sulfonyl)propane, 2-isopropyl carbonyl-2-(p-toluene sulfonyl)propane, etc.

Examples of the disulfone derivative may include: a diphenyl disulfone derivative, a diycyclohexyl disulfone derivative, etc.

Examples of the nitro benzyl sulfonate derivative may include: 2,6-dinitro benzyl p-toluenesulfonate, 2,4-dinitro benzyl p-toluenesulfonate, etc.

Examples of the sulfonate derivative may include: 1,2,3-tris(methane sulfonyloxy)benzene, 1,2,3-tris(trifluoromethane sulfonyloxy)benzene, 1,2,3-tris(p-toluene sulfonyloxy)benzene, etc.

Examples of the sulfonate derivative of N-hydroxy imide compound may include: N-hydroxy succinimide methane sulfonate, N-hydroxy succinimide trifluoromethane sulfonate, N-hydroxy succinimide ethane sulfonate, N-hydroxy succinimide 1-propane sulfonate, N-hydroxy succinimide 2-propane sulfonate, N-hydroxy succinimide 1-pentane sulfonate, N-hydroxy succinimide 1-octane sulfonate, N-hydroxy succinimide p-toluenesulfonate, N-hydroxy succinimide p-methoxybenzene sulfonate, N-hydroxy succinimide 2-chloroethane sulfonate, N-hydroxy succinimide benzenesulfonate, N-hydroxy succinimide-2,4,6-trimethyl benzene sulfonate, N-hydroxy succinimide 1-naphthalene sulfonate, N-hydroxy succinimide 2-naphthalene sulfonate, N-hydroxy-2-phenyl succinimide methane sulfonate, N-hydroxy maleimide methane sulfonate, N-hydroxy maleimide ethane sulfonate, N-hydroxy-2-phenyl maleimide methane sulfonate, N-hydroxy glutarimide methane sulfonate, N-hydroxy glutarimide benzenesulfonate, N-hydroxy phthalimide methane sulfonate, N-hydroxy phthalimide benzenesulfonate, N-hydroxy phthalimide trifluoromethane sulfonate, N-hydroxy phthalimide p-toluenesulfonate, N-hydroxy naphthalimide methane sulfonate, N-hydroxy naphthalimide benzenesulfonate, N-hydroxy-5-norbornene-2,3-dicarboxyimide methane sulfonate, N-hydroxy-5-norbornene-2,3-dicarboxyimide trifluoromethane sulfonate, N-hydroxy-5-norbornene-2,3-dicarboxyimide p-toluenesulfonate, etc.

Preferable examples thereof may include: an onium salt such as triphenyl sulfonium trifluoromethane sulfonate, (p-tert-butoxy phenyl)diphenyl sulfonium trifluoromethane sulfonate, tris(p-tert-butoxy phenyl)sulfonium trifluoromethane sulfonate, triphenyl sulfonium p-toluene sulfonate, (p-tert-butoxy phenyl)diphenyl sulfonium p-toluene sulfonate, tris(p-tert-butoxy phenyl)sulfonium p-toluene sulfonate, trinaphthylsulfonium trifluoromethane sulfonate, cyclohexyl methyl (2-oxocyclohexyl)sulfonium trifluoromethane sulfonate, (2-norbonyl)methyl (2-oxocyclohexyl) sulfonium trifluoromethane sulfonate, 1,2'-naphthyl carbonylmethyl tetrahydrothiophenium triflate, etc.;

a diazomethane derivative such as bis(benzene sulfonyl) diazomethane, bis(p-toluene sulfonyl)diazomethane, bis(cyclohexyl sulfonyl)diazomethane, bis(n-butylsulfonyl)diazomethane, bis(isobutyl sulfonyl)diazomethane, bis(sec-butylsulfonyl)diazomethane, bis(n-propyl sulfonyl) diazomethane, bis(isopropyl sulfonyl)diazomethane, bis(tert-butylsulfonyl)diazomethane, etc.;

a glyoxime derivative, such as bis-O-(p-toluene sulfonyl)-α-dimethylglyoxime, bis-O-(n-butane sulfonyl)-α-dimethylglyoxime, etc.;

a bissulfone derivative, such as bisnaphthyl sulfonyl methane;

a sulfonate derivative of N-hydroxyimide compounds, such as N-hydroxy succinimide methane sulfonate, N-hydroxy succinimide trifluoromethane sulfonate, N-hydroxy succinimide 1-propane sulfonate, N-hydroxy succinimide 2-propane sulfonate, N-hydroxy succinimide 1-pentane sulfonate, N-hydroxy succinimide p-toluene sulfonate, N-hydroxy naphthalimide methane sulfonate, N-hydroxy naphthalimide benzene sulfonate, etc.

The above-mentioned acid generator may be used alone or in admixture.

An amount of the acid generator to be added is preferably 0 to 50 parts, more preferably 0.1 to 40 parts per 100 parts of a base polymer. Acid generator is not indispensable. However, if 0.1 parts or more of acid generator is added, sufficient amount of acid is generated and a crosslinking reaction is induced sufficiently. If 50 parts or less of acid generator is added, there is little possibility that intermixing phenomenon in which acid migrates to a top resist layer or an intermediate resist layer.

Furthermore, a basic compound for improving preservation stability can be blended with a bottom resist layer composition of the present invention.

A compound which plays a role of a quencher to an acid to prevent an acid generated in a minute amount by an acid generator from promoting a crosslinking reaction is suitable as the basic compound.

Examples of such a basic compound may include: a primary, secondary and tertiary aliphatic amines, a mixed amine, an aromatic amine, a heterocyclic amine, a compound containing nitrogen which has a carboxy group, a compound containing nitrogen which has a sulfonyl group, a compound containing nitrogen which has a hydroxyl group, a compound containing nitrogen which has a hydroxy phenyl group, an alcoholic compound containing nitrogen, an amide derivative, an imide derivative, etc.

Examples of the primary aliphatic amine may include: ammonia, methylamine, ethylamine, n-propylamine, isopropylamine, n-butylamine, isobutyl amine, sec-butylamine, tert-butylamine, pentylamine, tert-amylamine, cyclopentyl amine, hexylamine, cyclohexyl amine, heptylamine, octylamine, nonylamine, decyl amine, dodecylamine, cetylamine, methylene diamine, ethylenediamine, tetraethylene pentamine and the like. Examples of the secondary aliphatic amine may include: dimethylamine, diethylamine, di-n-propylamine, diisopropyl amine, di-n-butylamine, diisobutyl amine, di-sec-butylamine, dipentylamine, dicyclopentyl amine, dihexyl amine, dicyclohexyl amine, diheptylamine, dioctylamine, dinonylamine, didecylamine, didodecylamine, dicetylamine, N,N-dimethyl methylenediamine, N,N-dimethyl ethylenediamine, N,N-dimethyl tetraethylene pentamine, etc. Examples of the tertiary aliphatic amine may include: trimethylamine, triethylamine, tri-n-propylamine, triisopropyl amine, tri-n-butyl amine, triisobutyl amine, tri-sec-butyl amine, tripentyl amine, tricyclopentyl amine, trihexyl amine, tricyclohexyl amine, triheptyl amine, trioctyl amine, trinonyl amine, tridecyl amine, tridodecyl amine, tricetyl amine, N,N,N',N'-tetra methyl methylene diamine, N,N,N',N'-tetramethyl ethylenediamine, N,N,N',N'-tetramethyl tetraethylene pentamine, etc.

Moreover, examples of the mixed amines may include: a dimethyl ethylamine, methyl ethyl propyl amine, benzylamine, phenethyl amine, benzyl dimethylamine, etc.

Examples of the aromatic amines and the heterocyclic amines may include: an aniline derivative (for example, aniline, N-methyl aniline, N-ethyl aniline, N-propyl aniline, N,N-dimethylaniline, 2-methyl aniline, 3-methyl aniline, 4-methyl aniline, ethyl aniline, propyl aniline, trimethyl aniline, 2-nitroaniline, 3-nitroaniline, 4-nitroaniline, 2,4-dinitro aniline, 2,6-dinitro aniline, 3,5-dinitro aniline, N,N-dimethyl toluidine, etc.), diphenyl(p-tolyl)amine, methyl diphenylamine, triphenylamine, phenylenediamine, naphthylamine, diamino naphthalene, a pyrrole derivative (for example, pyrrole, 2H-pyrrole, 1-methylpyrrole, 2,4-dimethylpyrrole, 2,5-dimethylpyrrole, N-methylpyrrole, etc.), an oxazole derivative (for example, oxazole, isoxazole, etc.), a thiazole derivative (for example, thiazole, isothiazole, etc.), an imidazole derivative (for example, imidazole, 4-methyl imidazole, 4-methyl-2-phenyl imidazole, etc.), a pyrazole derivative, a furazan derivative, a pyrroline derivative (for example, pyrroline, 2-methyl-1-pyrroline, etc.), a pyrrolidine derivative (for example, pyrrolidine, N-methylpyrrolidine, pyrrolidinone, N-methylpyrolidone, etc.), an imidazoline derivative, an imidazolidine derivative, a pyridine derivative (for example, pyridine, methylpyridine, ethyl pyridine, propyl pyridine, butyl pyridine, 4-(1-butyl pentyl)pyridine, dimethylpyridine, trimethylpyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridone, 4-pyrrolidino pyridine, 1-methyl-4-phenyl pyridine, 2-(1-ethylpropyl)pyridine, amino pyridine, dimethyl amino pyridine, etc.), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, etc.), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, a 1,10-phenanthroline derivative, an adenine derivative, an adenosine derivative, a guanine derivative, a guanosine derivative, an uracil derivative, an uridine derivative, etc.

Furthermore, examples of a compound containing nitrogen which has a carboxy group may include: aminobenzoic acid, indole carboxylic acid, an amino acid derivative (for example, nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, methoxy alanine), etc. Examples of a compound containing nitrogen which has a sulfonyl group may include: 3-pyridine sulfonic acid, pyridinium p-toluenesulfonate, etc. Examples of a compound containing nitrogen which has a hydroxyl group, a compound containing nitrogen which has a hydroxy phenyl group, and an alcoholic compound containing nitrogen may include: 2-hydroxy pyridine, amino cresol, 2,4-quinoline diol, 3-indole methanol hydrate, monoethanolamine, diethanolamine, triethanolamine, N-ethyl diethanolamine, N,N-diethyl ethanolamine, triisopropanol amine, 2,2'-iminodiethanol, 2-amino ethanol, 3-amino-1-propanol, 4-amino-1-butanol, 4-(2-hydroxyethyl) morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxy ethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, N-(2-hydroxyethyl)isonicotinamide, etc.

Examples of an amide derivative may include: formamide, N-methyl formamide, N,N-dimethylformamide, acetamide, N-methyl acetamide, N,N-dimethylacetamide, propione amide, benzamide, etc.

Examples of an imide derivative may include: phthalimide, succinimide, maleimide, etc.

An amount of the basic compound to be blended is preferably 0.001 to 2 parts, especially 0.01 to 1 parts per 100 parts of a total base polymer. If the amount is 0.001 parts or more, an effect of the blending is sufficiently obtained. If it is 2 parts or less, there is little possibility that all the acids generated by heat may be trapped, and a crosslinking may not be induced.

An organic solvent which can be used in a bottom resist layer composition of the present invention is not limited, as far as the polymer having a repeating unit represented by the general formula (1), an acid generator, a cross-linker, other additives, etc. can be dissolved. Examples thereof may include: ketones such as cyclohexanone, methyl-2-amyl ketone, etc.; alcohols such as 3-methoxy butanol, 3-methyl-3-methoxy butanol, 1-methoxy-2-propanol, 1-ethoxy-2-propanol, etc.; ethers, such as propylene glycol monomethyl ether, ethylene glycol monomethyl ether, propylene-glycol monoethyl ether, ethylene glycol monoethyl ether, propylene-glycol dimethyl ether, diethylene glycol dimethyl ether, etc.; esters, such as propylene-glycol-monomethyl-ether acetate, propylene-glycol monoethyl ether acetate, ethyl lactate, ethyl pyruvate, butyl acetate, methyl 3-methoxypropionate, ethyl 3-ethoxypropionate, tert-butyl acetate, tert-butyl propionate, propylene-glycol-monomethyl-ether acetate, propylene-glycol mono-tert-butyl-ether acetate, etc. They can be used alone or in admixture. However, they are not limited thereto.

Among the above-mentioned organic solvents, diethylene-glycol dimethyl ether, 1-ethoxy-2-propanol, ethyl lactate, propylene-glycol-monomethyl-ether acetate, propylene-glycol-monomethyl-ether and a mixed solvent thereof are preferably used for the bottom resist layer composition of the present invention.

An amount of the organic solvent to be blended is preferably 200 to 10,000 parts, especially 300 to 5,000 parts per 100 parts of the total base polymer.

Furthermore, the present invention provides a patterning process on a substrate with lithography wherein, at least, a bottom resist layer is formed on a substrate with the bottom resist layer composition according to the present invention, an intermediate resist layer containing silicon atoms is formed on the bottom resist layer, a top resist layer of a photoresist composition is formed on the intermediate resist layer, to form a trilayer resist film, a pattern circuit area of the trilayer resist film is exposed and developed with a developer to form a resist pattern on the top resist layer, the intermediate resist layer is etched using as a mask the top resist layer on which the pattern is formed, the bottom resist layer is etched using as a mask at least the intermediate resist layer on which the pattern is formed, and then the substrate is etched using as a mask at least the bottom resist layer on which the pattern is formed, to form the pattern on the substrate.

Such a trilayer resist process will be explained with reference to FIG. 6.

A bottom resist layer 22 of the present invention can be formed on a substrate 21 by a spin-coating etc. as in a method of forming a photoresist film. After forming the bottom resist layer 22 by spin-coating etc., it is preferable that an organic solvent is evaporated, and baking is carried out in order to promote a crosslinking reaction to prevent intermixing with an intermediate resist layer 24. The baking is preferably carried out at a temperature in a range of 80 to 300° C., for 10 to 300 seconds. Although a thickness of the bottom resist layer 22 is selected appropriately, it is preferably 30 to 20,000 nm, and especially 50 to 15,000 nm.

Next, in the case of a trilayer resist process, an intermediate resist layer 24 containing silicon is formed on the bottom layer, furthermore, thereon single resist layer without silicon (a top resist layer 23) is formed (see FIG. 6 (a)).

In this case, a known photoresist composition can be used to form the top resist layer. Namely, the top resist layer 23 in a trilayer resist process may be a positive type or a negative type, and usual single resist layer compositions can be used as the photoresist composition.

On the other hand, a composition based on polysilsesquioxane can be preferably used to form the intermediate resist layer 24 containing silicon for a trilayer resist process. Reflection from a substrate can be suppressed by giving an antireflection effect to the intermediate resist layer 24. In particular, if a composition containing a large amount of aromatic groups and having a high etching resistance during etching a substrate is used to form a bottom resist layer for exposure to light at a wavelength of 193 nm, k value becomes high and a reflectivity of a substrate becomes high. However, a reflectivity of a substrate can be suppressed to 0.5% or less by suppressing reflection with an intermediate resist layer. As an intermediate resist layer with an antireflection effect, polysilsesquioxane having a phenyl group or an absorption group having an Si—Si bond as a pendant group that crosslinks with acid or heat is preferably used for exposure to light at a wavelength of 193 nm. SiON etc. are also known as an intermediate resist layer with an antireflection effect.

When the intermediate resist layer 24 and the top resist layer 23 are formed, sping-coating is preferably used as in the case of forming the above-mentioned bottom resist layer. In addition, an intermediate resist layer formed with Chemical Vapor Deposition (CVD) method can also be used. The spin-coating is easier than the CVD method and has advantage of cost to form an intermediate resist layer.

After the top resist layer 23 is formed with spin-coating etc., pre-baking is carried out, preferably at a temperature of 80 to 180° C. for 10 to 300 seconds. In addition, a thickness of the top resist layer 23 is not limited, however, 30 to 500 nm, in particular, 50 to 400 nm is preferable.

Then, according to a conventional method, a pattern circuit area 25 of a trilayer resist film is exposed (see FIG. 6 (b)), and post exposure baking (PEB) and development are carried out to obtain a resist pattern on the top resist layer (see FIG. 6 (c)).

As an exposure light, high energy beams at a wavelength of 300 nm or less can be used. Examples thereof may include: excimer lasers at a wavelength of 248 nm, 193 nm, and 157 nm, soft X-ray at a wavelength of 3 to 20 nm, electron beam, X-ray, etc. Among these, laser beam of KrF excimer laser at a wavelength of 248 nm and laser beam of ArF excimer laser at a wavelength of 193 nm are preferably used.

The development is carried out with a puddle method, a dip method, etc. using an alkaline solution. Preferably, the puddle method using a 2.38% by mass aqueous solution of tetramethyl ammonium hydroxide is used, and it is carried out at a room temperature for 10 to 300 seconds. Then, it is rinsed with pure water, and is dried by a spin dry, a nitrogen blow, etc.

Then, etching is carried out using obtained resist pattern as a mask.

Etching of the intermediate resist layer 24 in a trilayer resist process is carried out with a gas mainly containing fluorocarbon gas etc. using the resist pattern as a mask (see FIG. 6 (d)). Next, etching of the bottom resist layer 22 is carried out by dry etching etc. with a gas mainly containing oxygen gas using the resist pattern transferred to the intermediate resist layer 24 as a mask (see FIG. 6 (e)). In the case of the dry etching with a gas mainly containing oxygen gas, it is also possible to add an inert gas such as He, Ar, etc. and CO, $CO_2$, $NH_3$, $SO_2$, $N_2$, $NO_2$ and $H_2$ gas in addition to oxygen gas. In addition, the etching can be carried out with just CO, $CO_2$, $NH_3$, $SO_2$, $N_2$, $NO_2$ and $H_2$ gas. Especially the latter gases are used for protection of a side wall to prevent undercut of a side wall of a pattern.

Next, etching of the substrate 21 can also be carried out by a conventional method. For example, etching with a gas mainly containing fluorocarbon gas is carried out in the case that the substrate is $SiO_2$, SiN or silica-type low-dielectric-constant insulator film. Etching with a gas mainly containing a chlorine gas or a bromine gas is carried out in the case that the substrate is poly silicon (p-Si), Al or W (see FIG. 6(f)).

In the case of etching the substrate with a gas mainly containing fluorocarbon gas, the intermediate resist layer 24 containing silicon in a trilayer resist process is removed during etching of the substrate.

In the case of etching the substrate with a gas mainly containing a chlorine gas or a bromine gas, it is necessary to remove the intermediate resist layer 24 containing silicon by carrying out dry etching with a gas mainly containing fluorocarbon gas separately from etching the substrate.

The bottom resist layer of the present invention is characterized by having an excellent etching resistance during etching a substrate.

In addition, as shown in FIG. 6, the substrate 21 may consist of a processed layer 21b and a base layer 21a. The base layer 21a of the substrate 21 is not limited and may be Si, an amorphous silicon (a-Si), p-Si, $SiO_2$, SiN, SiON, W, TiN, Al, etc. And a different material from a processed layer 21b may be used. As the processed layer 21b, Si, $SiO_2$, SiON, SiN, p-Si, α-Si, W, W—Si, Al, Cu, Al—Si, etc., various low dielectric constant films, and an etching stopper film thereof may be used, and it may be formed generally at a thickness of 50 to 10,000 nm, especially at a thickness of 100 to 5,000 nm.

EXAMPLES

Hereafter the present invention will be explained in detail with reference to Synthetic Examples, Examples and Comparative Examples. However, the present invention is not limited thereto.

In addition, as for measurement of molecular weight, mass average molecular weight (Mw) and number average molecular weight (Mn) relative to polystyrene standards were determined by gel permeation chromatography (GPC), and molecular-weight distribution (Mw/Mn) was determined.

Synthetic Example 1

To a 300 mL flask 160 g of m-cresol, 50 g of 1-naphthol, 75 g of 37% formalin solution and 5 g of oxalic acid were added, and the contents were stirred at 100° C. for 24 hours. After the reaction, the contents were dissolved into 500 mL of methyl isobutyl ketone. Then, a catalyst and metallic impurities were removed by sufficient washing with water, and the solvent was removed under a reduced pressure. And the solution was subjected to a condition of at a temperature of 150° C. and at a reduced pressure of 2 mmHg, and water and unreacted monomer were removed to yield 188 g of the following polymer 1.

Molecular weight (Mw) and distribution (Mw/Mn) of polymer 1 were determined by GPC, and a ratio of repeating units in polymer 1 was determined as follows by $^1$H-NMR analysis.

polymer 1; a1:b1 (mole ratio)=0.8:0.2
Molecular weight (Mw)=12,000
Molecular-weight distribution (Mw/Mn)=4.60

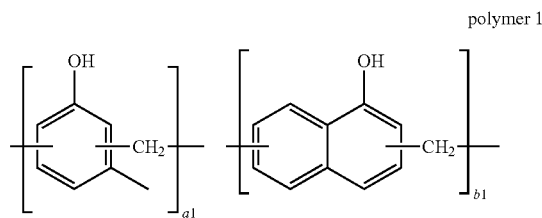

polymer 1

Synthetic Example 2

To a 300 mL flask 160 g of m-cresol, 70 g of 1-hydroxy pyrene, 75 g of 37% formalin solution and 5 g of oxalic acid were added, and the contents were stirred at 100° C. for 24 hours. After the reaction, the contents were dissolved into 500 mL of methyl isobutyl ketone. Then, a catalyst and metallic impurities were removed by sufficient washing with water, and the solvent was removed under a reduced pressure. And the solution was subjected to a condition of at a temperature of 150° C. and at a reduced pressure of 2 mmHg, and water and unreacted monomer were removed to yield 193 g of the following polymer 2.

Molecular weight (Mw) and molecular-weight distribution (Mw/Mn) of polymer 2 were determined by GPC, and a ratio of repeating units in polymer 2 was determined as follows by $^1$H-NMR analysis.

polymer 2; a1:b2 (mole ratio)=0.83:0.17
Molecular weight (Mw)=12,700
Molecular-weight distribution (Mw/Mn)=4.80

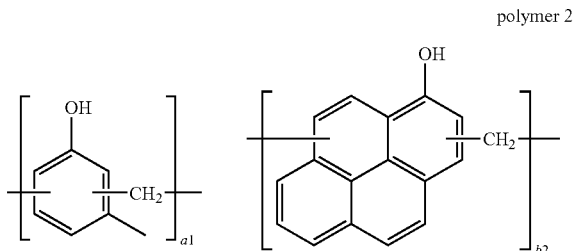

polymer 2

Synthetic Example 3

To a 300 mL flask 160 g of m-cresol, 60 g of 2-hydroxy fluorene, 75 g of 37% formalin solution and 5 g of oxalic acid were added, and the contents were stirred at 100° C. for 24 hours. After the reaction, the contents were dissolved into 500 mL of methyl isobutyl ketone. Then, a catalyst and metallic impurities were removed by sufficient washing with water, and the solvent was removed under a reduced pressure. And the solution was subjected to a condition of at a temperature of 150° C. and at a reduced pressure of 2 mmHg, and water and unreacted monomer were removed to yield 190 g of the following polymer 3.

Molecular weight (Mw) and a molecular-weight distribution (Mw/Mn) of polymer 3 were determined by GPC, and a ratio of repeating units in polymer 3 was determined as follows by $^1$H-NMR analysis.

polymer 3; a1:b3 (mole ratio)=0.75:0.25
Molecular weight (Mw)=10,800
Molecular-weight distribution (Mw/Mn)=4.30

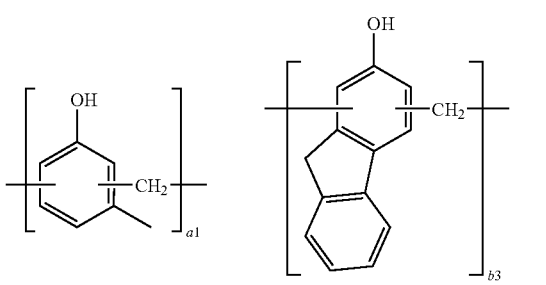

polymer 3

Synthetic Example 4

To a 300 mL flask 160 g of m-cresol, 50 g of 6-hydroxy indene, 75 g of 37% formalin solution and 5 g of oxalic acid were added, and the contents were stirred at 100° C. for 24 hours. After the reaction, the contents were dissolved into 500 mL of methyl isobutyl ketone. Then, a catalyst and metallic impurities were removed by sufficient washing with water, and the solvent was removed under a reduced pressure. And the solution was subjected to a condition of at a temperature of 150° C. and at a reduced pressure of 2 mmHg, and water and unreacted monomer were removed to yield 175 g of the following polymer 4.

Molecular weight (Mw) and molecular-weight distribution (Mw/Mn) of polymer 4 were determined by GPC, and a ratio of repeating units in polymer 4 was determined as follows by $^1$H-NMR analysis.

polymer 4; a1:b4 (mole ratio)=0.68:0.32
Molecular weight (Mw)=9,800
Molecular-weight distribution (Mw/Mn)=5.30

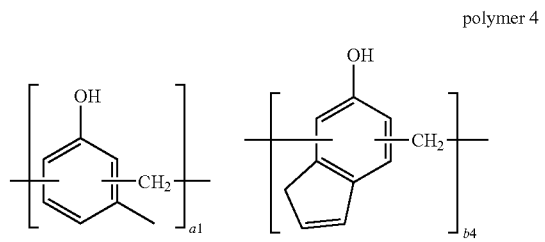

polymer 4

Synthetic Example 5

To a 1 L flask 125 g of polymer 1 (m-cresol-1-naphthol resin) obtained in the above Synthetic Example 1 and 300 g of epichlorohydrin were added and dissolved. The temperature of the contents was elevated to 80° C., and 220 g of 20% sodium hydroxide was added dropwise for 3 hours with stirring the contents. After stirring for aging of 1 hour, brine of underlayer was isolated, and unreacted epichlorohydrin was removed with distillation with heating at 150° C. Next, after 300 g of MIBK (methyl isobutyl ketone) was added and the contents were dissolved, the lower aqueous layer was removed by repeating separation by washing with water three times, followed by drying and filtration. And then MIBK as the solvent was removed by heating at 150° C., to yield 140 g of the following polymer 5.

Molecular weight (Mw) and molecular-weight distribution (Mw/Mn) of polymer 5 were determined by GPC, and a ratio of repeating units in polymer 5 was determined as follows by $^1$H-NMR analysis.

polymer 5; a2:b5:a1:b1 (mole ratio)=0.4:0.06:0.4:0.14
Molecular weight (Mw)=12,800
Molecular-weight distribution (Mw/Mn)=4.60

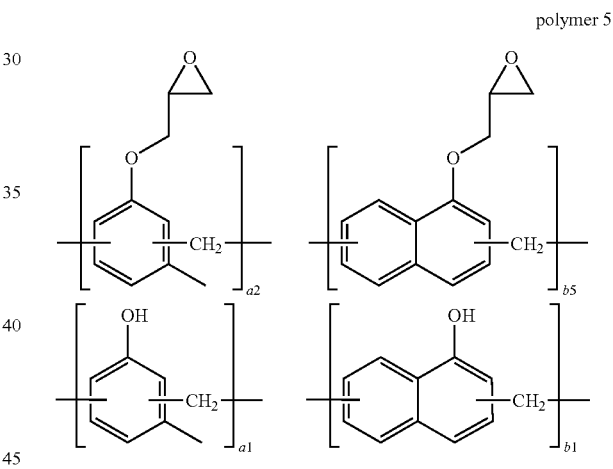

polymer 5

Synthetic Example 6

In a 2 L flask 125 g of polymer 1 (m-cresol-1-naphthol resin) obtained in the above Synthetic Example 1 was dissolved in 1000 mL of pyridine, and 56 g of di-tert-butyl dicarbonate was added with stirring at 45° C. After reacting for 1 hour, the reaction solution was dropped into 3 L of water to obtain white solid. The solid was filtrated, dissolved into 400 mL of acetone, dropped into 10 L of water, and filtration and vacuum drying were carried out to yield the following polymer 6.

Molecular weight (Mw) and molecular-weight distribution (Mw/Mn) of polymer 6 were determined by GPC, and a ratio of repeating units in polymer 6 was determined as follows by $^1$H-NMR analysis.

polymer 6; a3:b6:a1:b1 (mole ratio)=0.2:0.04:0.6:0.16
Molecular weight (Mw)=12,600
Molecular-weight distribution (Mw/Mn)=4.60

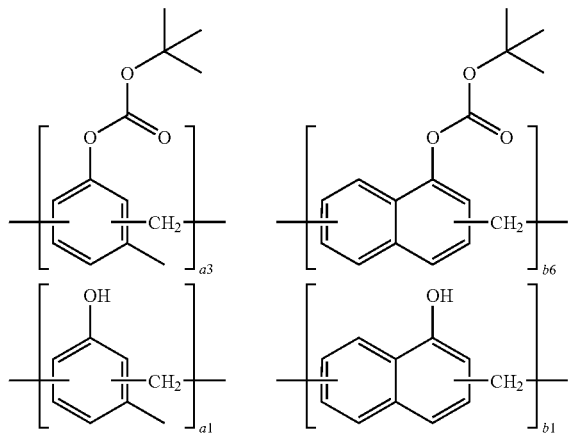

polymer 6

Synthetic Example 7

To a 300 mL flask 220 g of m-phenyl-phenol, 50 g of 1-naphthol, 75 g of 37% formalin solution and 5 g of oxalic acid were added, and the contents were stirred at 100° C. for 24 hours. After the reaction, the contents were dissolved into 500 mL of methyl isobutyl ketone. Then, a catalyst and a metallic impurities were removed by sufficient washing with water, and the solvent was removed under a reduced pressure. And the solution was subjected to a condition of at a temperature of 150° C. and at a reduced pressure of 2 mmHg, and water and unreacted monomer were removed to yield 168 g of the following polymer 7.

Molecular weight (Mw) and molecular-weight distribution (Mw/Mn) of polymer 7 were determined by GPC, and a ratio of repeating units in polymer 7 was determined as follows by $^1$H-NMR analysis.

polymer 7; a4:b1 (mole ratio)=0.8:0.2
Molecular weight (Mw)=6,000
Molecular-weight distribution (Mw/Mn)=4.70

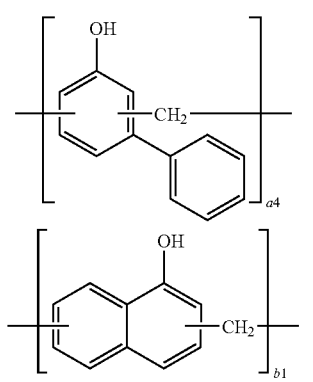

polymer 7

Comparative Synthetic Example 1

To a 300 mL flask 200 g of m-cresol, 75 g of 37% formalin solution and 5 g of oxalic acid were added, and the contents were stirred at 100° C. for 24 hours. After the reaction, the contents were dissolved into 500 mL of methyl isobutyl ketone. Then, a catalyst and metallic impurities were removed by sufficient washing with water, and the solvent was removed under a reduced pressure. And the solution was subjected to a condition of at a temperature of 150° C. and at a reduced pressure of 2 mmHg, and water and unreacted monomer were removed to yield 193 g of the following comparative polymer 1.

Molecular weight (Mw) and molecular-weight distribution (Mw/Mn) of comparative polymer 1 were determined by GPC, and a ratio of repeating units in comparative polymer 1 was determined as follows by $^1$H-NMR analysis.

comparative polymer 1; a1=1.0
Molecular weight (Mw)=18,000
Molecular-weight distribution (Mw/Mn)=4.80

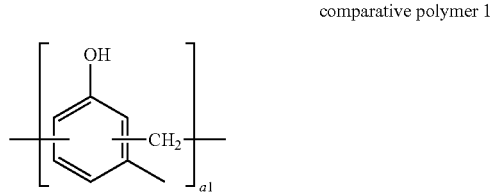

comparative polymer 1

Comparative Synthetic Example 2

To a 300 mL flask 200 g of 1-naphthol, 75 g of 37% formalin solution and 5 g of oxalic acid were added, and the contents were stirred at 100° C. for 24 hours. After the reaction, the contents were dissolved into 500 mL of methyl isobutyl ketone. Then, a catalyst and metallic impurities were removed by sufficient washing with water, and the solvent was removed under a reduced pressure. And the solution was subjected to a condition of at a temperature of 150° C. and at a reduced pressure of 2 mmHg, and water and unreacted monomer were removed to yield 85 g of the following comparative polymer 2.

Molecular weight (Mw) and molecular-weight distribution (Mw/Mn) of comparative polymer 2 were determined by GPC, and a ratio of repeating units in comparative polymer 2 was determined as follows by $^1$H-NMR analysis.

comparative polymer 2; b1=1.0
Molecular weight (Mw)=1,100
Molecular-weight distribution (Mw/Mn)=3.40

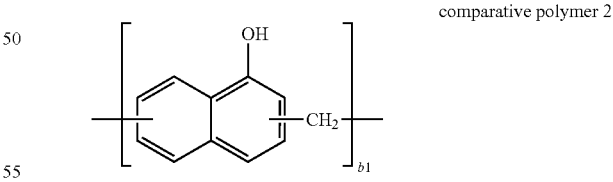

comparative polymer 2

Comparative Synthetic Example 3

To a 300 mL flask 200 g of 1-hydroxy pyrene, 75 g of 37% formalin solution and 5 g of oxalic acid were added, and the contents were stirred at 100° C. for 24 hours. After the reaction, the contents were dissolved into 500 mL of methyl isobutyl ketone. Then, a catalyst and metallic impurities were removed by sufficient washing with water, and the solvent was removed under a reduced pressure. And the solution was subjected to a condition of at a temperature of 150° C. and at a reduced pressure of 2 mmHg, and water was removed. However, polymer was not obtained.

Blend Polymer Synthetic Example 1

As a base polymer for blending, 1-naphthol-dicyclo pentadiene novolac resin was synthesized by copolycondensation with oxalic acid to yield the following blend polymer 1.

blend polymer 1; c:d (mole ratio)=0.6:0.4
Molecular weight (Mw)=1,300
Molecular-weight distribution (Mw/Mn)=3.6 blend polymer 1

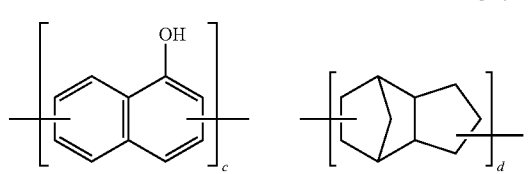

Blend Polymer Synthetic Example 2

As a base polymer for blending, acenaphthylene-hydroxy styrene was synthesized by cationic polymerization to yield the following blend polymer 2.

blend polymer 2; e:f (mole ratio)=0.8:0.2
Molecular weight (Mw)=3,200
Molecular-weight distribution (Mw/Mn)=1.55 blend polymer 2

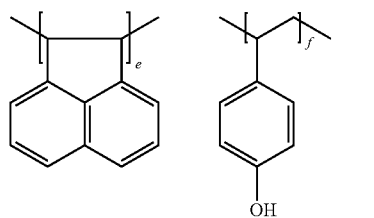

Blend Polymer Synthetic Example 3

As a base polymer for blending, 4,4'-(9H-fluorene-9-ylidene)bisphenol was turned into a novolac resin by using formalin to yield the following blend polymer 3.

blend polymer 3; Molecular weight (Mw)=8,800
Molecular-weight distribution=4.50 blend polymer 3

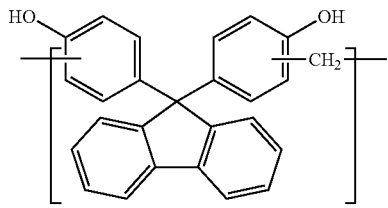

Examples

Comparative Examples

Preparation of Bottom Resist Layer Compositions and Intermediate Resist Layer Compositions Solutions of bottom resist layer compositions (Examples 1-15, and Comparative Examples 1 and 2) and solutions of intermediate resist layer compositions (SOG 1 and SOG 2) were prepared respectively by dissolving the polymers of the Synthetic Examples 1-7, the Comparative Synthetic Examples 1 and 2 and the Blend polymer Synthetic Examples 1-3, silicon containing intermediate layer polymers shown below as silicon containing KrF intermediate layer polymer 1 and silicon containing ArF intermediate layer polymer 1, acid generators shown below as AG1 and AG2 and cross-linkers shown below as CR 1 and CR 2 at a ratio shown in Table 1 in an organic solvent containing 0.1% by mass of FC-430 (manufactured by Sumitomo 3M), and filtering them with a 0.1 μm filter made of fluoroplastics.

Each of the compositions in Table 1 is as follows.

Polymer 1-7: obtained in the Synthetic Example 1-7

Blend polymer 1-3: obtained in the Blend polymer Synthetic Example 1-3

Comparative polymer 1-2: obtained in the Comparative Example 1-2 silicon containing intermediate layer polymer:silicon containing ArF intermediate layer polymer 1 [mole ratio (o:p:q)=0.2:0.5:0.3, Molecular weight (Mw)=3,400], silicon containing KrF intermediate layer polymer 1 [mole ratio (m:n)=0.3:0.7, Molecular weight (Mw)=2,500], (see the following structural formulae)

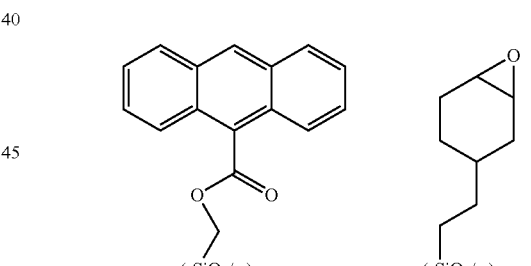

silicon containing KrF intermediate layer polymer 1

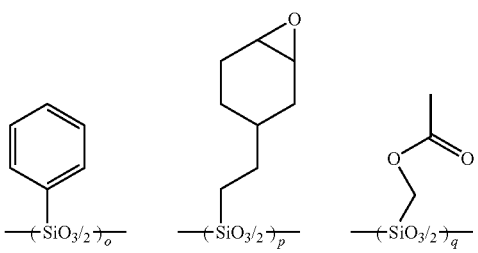

silicon containing ArF intermediate layer polymer 1

Acid generator: AG1 and AG2 (see the following structural formulae)

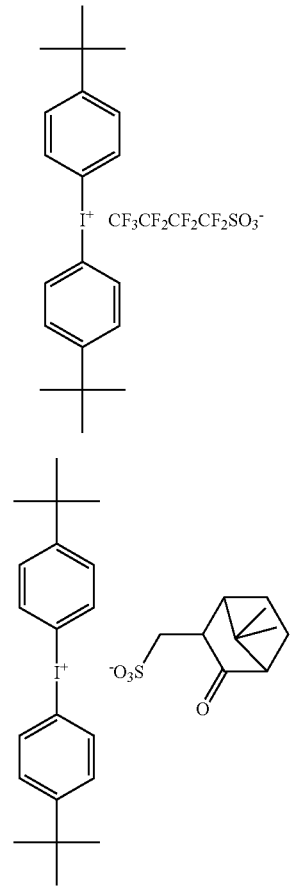

Cross-linker: CR1 and CR2 (see the following structural formulae)

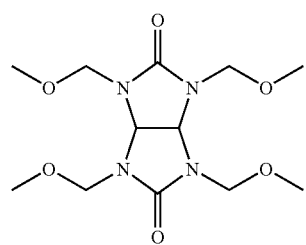

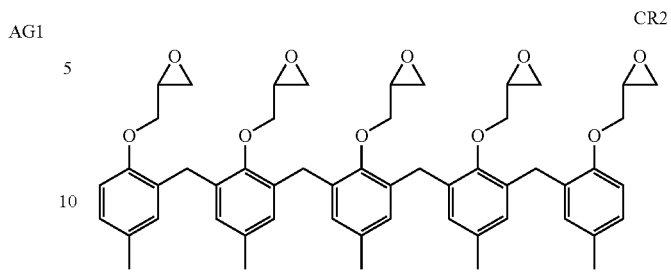

Organic solvent: PGMEA (propylene glycol monomethyl ether acetate)

The bottom resist layer compositions (Examples 1-15, Comparative Examples 1 and 2) prepared above were applied on a silicon substrate 8 inches (about 200 mm) across, and baked for 60 seconds at 300° C. in the Examples 1-3, baked for 60 seconds at 200° C. in the Examples 4-15 and the Comparative Examples 1 and 2 to form bottom resist layers with a thickness of 300 nm. In addition, as intermediate resist layers, the solutions of the intermediate resist layer compositions (SOG 1 and SOG 2) prepared above were applied by spin-coating, and baked for 60 seconds at 200° C. to fonts silicon containing intermediate resist layers with a thickness of 100 nm, respectively.

After formation of the bottom resist layers and the intermediate resist layers, the refractive index (n, k) of the bottom resist layers and the intermediate resist layers at a wavelength of 193 nm and 248 nm were measured using an incident light angle variable spectroscopic ellipsometer (VASE) manufactured by J.A. Woollam Co., Inc. The results were shown in Table 1.

In addition, layer-thickness of the whole plane of wafers 8 inches across was determined using an a film thickness measurement system Lambda Ace manufactured by Dainippon Screen Mfg. Co., Ltd., and difference of the maximum volume and the minimum value of the layer-thickness was calculated. The results were shown in Table 1 as "uniformity of layer".

TABLE 1

| bottom resist layer composition etc. | polymer (parts by mass) | crosslinker (parts by mass) | acid generator (parts by mass) | organic solvent (parts by mass) | uniformity of layer (nm) | refractive index (193 nm) | | refractive index (248 nm) | |
|---|---|---|---|---|---|---|---|---|---|
| | | | | | | n value | k value | n value | k value |
| Example 1 | polymer 1 (20) | — | — | PGMEA (100) | 3 | 1.48 | 0.55 | 1.95 | 0.28 |
| Example 2 | polymer 2 (20) | — | — | PGMEA (100) | 3 | 1.46 | 0.57 | 2.06 | 0.17 |
| Example 3 | polymer 3 (20) | — | — | PGMEA (100) | 3 | 1.49 | 0.53 | 1.86 | 0.15 |
| Example 4 | polymer 1 (20) | CR1 (2.0) | AG1 (0.1) | PGMEA (100) | 1 | 1.49 | 0.53 | 1.96 | 0.21 |
| Example 5 | polymer 2 (20) | CR1 (2.0) | AG1 (0.1) | PGMEA (100) | 1 | 1.48 | 0.55 | 2.03 | 0.15 |
| Example 6 | polymer 3 (20) | CR1 (2.0) | AG1 (0.1) | PGMEA (100) | 1 | 1.50 | 0.51 | 1.88 | 0.12 |
| Example 7 | polymer 4 (20) | CR1 (2.0) | AG1 (0.1) | PGMEA (100) | 1 | 1.48 | 0.52 | 1.83 | 0.03 |
| Example 8 | polymer 5 (20) | — | AG1 (0.1) | PGMEA (100) | 3 | 1.49 | 0.53 | 1.94 | 0.22 |
| Example 9 | polymer 6 (20) | — | AG1 (0.1) | PGMEA (100) | 3 | 1.49 | 0.52 | 1.98 | 0.21 |

TABLE 1-continued

| bottom resist layer composition etc. | polymer (parts by mass) | crosslinker (parts by mass) | acid generator (parts by mass) | organic solvent (parts by mass) | uniformity of layer (nm) | refractive index (193 nm) n value | refractive index (193 nm) k value | refractive index (248 nm) n value | refractive index (248 nm) k value |
|---|---|---|---|---|---|---|---|---|---|
| Example 10 | polymer 7 (20) | — | AG1 (0.1) | PGMEA (100) | 3 | 1.40 | 0.55 | 1.85 | 0.20 |
| Example 11 | polymer 1 (20) | CR2 (2.0) | AG1 (0.1) | PGMEA (100) | 2 | 1.44 | 0.55 | 1.98 | 0.22 |
| Example 12 | polymer 1 (20) | CR1 (2.0) | AG2 (0.1) | PGMEA (100) | 1 | 1.46 | 0.33 | 1.92 | 0.21 |
| Example 13 | blend polymer 1 (10) polymer 1 (10) | CR2 (2.0) | AG1 (0.1) | PGMEA (100) | 3 | 1.52 | 0.40 | 1.78 | 0.28 |
| Example 14 | blend polymer 2 (10) polymer 1 (10) | CR1 (2.0) | AG2 (0.1) | PGMEA (100) | 2 | 1.43 | 0.45 | 1.96 | 0.12 |
| Example 15 | blend polymer 3 (10) polymer 1 (10) | CR1 (2.0) | AG1 (0.1) | PGMEA (100) | 2 | 1.37 | 0.58 | 2.05 | 0.28 |
| SOG 1 | silicon containing ArF intermediate layer polymer 1 (20) | — | AG1 (1) | PGMEA (1000) | 1 | 1.66 | 0.15 | 1.60 | 0.01 |
| SOG 2 | silicon containing KrF intermediate layer polymer 1 (20) | — | AG1 (1) | PGMEA (1000) | 1 | 1.53 | 0.28 | 1.78 | 0.15 |
| Comparative Example 1 | comparative polymer1 (28.0) | CR1 (2.0) | AG1 (1) | PGMEA (100) | 8 | 1.30 | 0.63 | 1.96 | 0.06 |
| Comparative Example 2 | comparative polymer2 (28.0) | CR1 (2.0) | AG1 (1) | PGMEA (100) | 30 | 1.32 | 0.32 | 2.10 | 0.36 |

As shown in Table 1, the bottom resist layers in the Examples 1-15 has excellent uniformity of layer after application, has appropriate refractive index (n, k) at a wavelength of 193 nm, namely k value is in a range of 0.2 to 0.8, has also appropriate refractive index (n, k) at a wavelength of 248 nm, and a sufficient antireflection effect can be obtained by combining with an intermediate resist layer if necessary.

[Preparation of Top Resist Layer Compositions]

The following polymers (KrF single layer resist polymer 1 and ArF single layer resist polymer 1) were prepared as base resins of top resist layers.

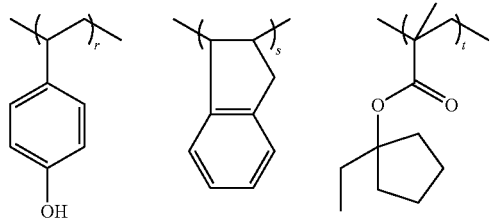

KrF single layer resist polymer 1

KrF single layer resist polymer 1 consists of the repeating units r, s and t shown above. A copolymerization mole ratio and molecular weight (Mw) of the polymer are shown below.
Copolymerization mole ratio; r:s:t=0.70:0.10:0.20
Molecular weight (Mw)=9,300

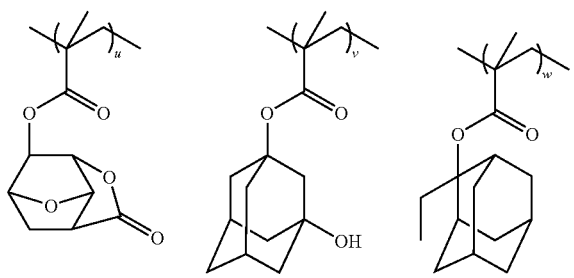

ArF single layer resist polymer 1

ArF single layer resist polymer 1 consists of the repeating units u, v and w shown above. A copolymerization mole ratio and molecular weight (Mw) of this polymer are shown below.
Copolymerization mole ratio; u:v:w=0.40:0.30:0.30
Molecular weight (Mw)=7,800

Solution of KrF top resist layer composition and Solution of ArF top resist layer composition were prepared by dissolving the polymers prepared above (KrF single layer resist polymer 1 and ArF single layer resist polymer 1), an acid generator (PAG1) and a basic compound (TMMEA) at a ratio shown in Table 2 in an organic solvent containing 0.1% by mass of FC-430 (manufactured by Sumitomo 3M), and filtering them with a 0.1 μm filter made of fluoroplastics.

Each of the compositions in Table 2 is as follows.

Acid Generator: PAG1 (See the Following Structural Formula)

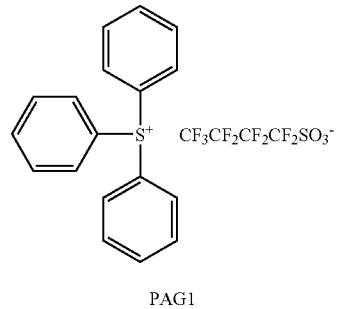

PAG1 basic compound: TMMEA (see the following structural formula)

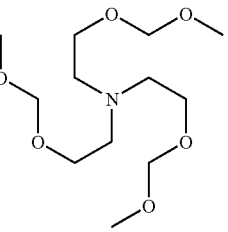

TMMEA

Organic solvent: PGMEA (propylene glycol monomethyl ether acetate)

TABLE 2

| top resist layer composition | polymer (parts by mass) | acid generator (parts by mass) | basic compound (parts by mass) | organic solvent (parts by mass) |
|---|---|---|---|---|
| KrF top resist layer composition | KrF single layer resist polymer 1 (100) | PAG1 (4.0) | TMMEA (0.3) | PGMEA (1,200) |
| ArF top resist layer composition | ArF single layer resist polymer 1 (100) | PAG1 (2.2) | TMMEA (0.3) | PGMEA (1,200) |

[Observation of a Pattern Profile]
(1) Observation of a Resist Pattern Profile
1) Exposure to KrF The solutions of the bottom resist layer compositions (Examples 1, 4, 8-15) prepared above were applied on a substrate having an $SiO_2$ film with a thickness of 300 nm, baked for 60 seconds at 300° C. in the Example 1, and baked for 60 seconds at 200° C. in the Examples 4, 8-15, to form bottom resist layers with a thickness of 400 nm. Next, thereon the solution of the intermediate resist layer composition (SOG 2) prepared above was applied, and baked for 60 seconds at 200° C., to form an intermediate resist layer with a thickness of 80 nm. Next, the solution of the KrF top resist layer composition prepared above was applied, and baked for 60 seconds at 120° C., to form a top resist layer with a thickness of 150 nm. Subsequently, it was exposed by the KrF exposure system (S203B, NA0.68, σ0.7, ⅔ annular illumination, an attenuated phase shifting mask with a transmission of 6%, manufactured by Nikon Corporation), baked (PEB) for 60 seconds at 110° C., and developed in 2.38% by mass aqueous solution of tetra methyl ammonium hydroxide (TMAH), to obtain a positive resist pattern. The results of observation of the pattern profile of 0.14 μm L/S with an electron microscope manufactured by Hitachi Ltd. (S-4700) were shown in Table 3.

2) Exposure to ArF

The solutions of the bottom resist layer compositions (Examples 1-15, Comparative Examples 1-2) prepared above were applied on a substrate having an $SiO_2$ film with a thickness of 300 nm, baked for 60 seconds at 300° C. in the Examples 1-3, and baked for 60 seconds at 200° C. in the Examples 4-15 and Comparative Examples 1-2, to form bottom resist layers with a thickness of 200 nm. Next, thereon the solution of the intermediate resist layer composition (SOG 1) was applied, and baked for 60 seconds at 200° C., to form an intermediate resist layer with a thickness of 70 nm. Next, the solution of the ArF top resist layer composition prepared above was applied, and baked for 60 seconds at 130° C., to form a top resist layer with a thickness of 150 nm. Subsequently, it was exposed by the ArF exposure system (S307E, NA0.85, σ0.93, ⅘ annular illumination, an attenuated phase shifting mask with a transmission of 6%, manufactured by Nikon Corporation), baked (PEB) for 60 seconds at 110° C., and developed in 2.38% by mass aqueous solution of tetra methyl ammonium hydroxide (TMAH), to obtain a positive resist pattern. The results of observation of the pattern profile of 0.08 μm L/S with an electron microscope (S-4700) manufactured by Hitachi Ltd. were shown in Table 4.

(2) Observation of a Pattern Profile Transferred to an Intermediate Resist Layer Next, after a resist pattern was formed using the same compositions and method as those used in the above-mentioned "Observation of a resist pattern profile", thus-obtained resist pattern was transferred to an intermediate resist layer under the following conditions.

The etching conditions were as follows.
Chamber pressure: 40.0 Pa
RF power: 1,000 W
Gap: 9 mm
$CHF_3$ gas flow rate: 20 ml/min
$CF_4$ gas flow rate: 60 ml/min
Ar gas flow rate: 200 ml/min
Time: 30 sec The results of observation of thus-obtained pattern profile with an electron microscope (S-4700) manufactured by Hitachi Ltd. were shown in Table 3 and 4.

(3) Observation of a Pattern Profile Transferred to a Bottom Resist Layer

Next, after a resist pattern was transferred to an intermediate resist layer using the same compositions and method as those used in the above-mentioned "Observation of a pattern profile transferred to an intermediate resist layer", thus-obtained resist pattern was transferred to a bottom resist layer by etching with a gas mainly containing oxygen gas.

The etching conditions were as follows.
Chamber pressure: 450 mTorr (60.0 Pa)
RF power: 600 W
Ar gas flow rate: 40 sccm
$O_2$ gas flow rate: 60 sccm
Gap: 9 mm
Time: 20 sec The results of observation of thus-obtained pattern profile with an electron microscope (S-4700) manufactured by Hitachi Ltd. were shown in Table 3 and 4.

(4) Observation of a Pattern Profile Formed on a Substrate

Next, a pattern was formed on a bottom resist layer using the same compositions and method as those used in the above-mentioned "Observation of a pattern profile transferred to a bottom resist layer", the bottom resist layer was used as a mask and a substrate was etched with a gas mainly containing $CF_4/CHF_3$ gas using a dry-etching-system TE-8500P manufactured by Tokyo Electron, Ltd.

The etching conditions were as follows.
Chamber pressure: 40.0 Pa
RF power: 1,300 W
gap: 9 mm
$CHF_3$ gas flow rate: 30 ml/min
$CF_4$ gas flow rate: 30 ml/min
Ar gas flow rate: 100 ml/min
Time: 60 sec The results of observation of thus-obtained pattern profile with an electron microscope (S-4700) manufactured by Hitachi Ltd. were shown in Table 3 and 4.

TABLE 3

| bottom resist layer composition | top resist layer composition | pattern profile after development | pattern profile after transfer-etching intermediate resist layer | pattern profile after transfer-etching bottom resist layer | pattern profile after transfer-etching substrate |
|---|---|---|---|---|---|
| Example 1 | KrF top resist layer composition | rectangle | rectangle | rectangle | rectangle |
| Example 4 | KrF top resist layer composition | rectangle | rectangle | rectangle | rectangle |
| Example 8 | KrF top resist layer composition | rectangle | rectangle | rectangle | rectangle |
| Example 9 | KrF top resist layer composition | rectangle | rectangle | rectangle | rectangle |
| Example 10 | KrF top resist layer composition | rectangle | rectangle | rectangle | rectangle |
| Example 11 | KrF top resist layer composition | rectangle | rectangle | rectangle | rectangle |
| Example 12 | KrF top resist layer composition | rectangle | rectangle | rectangle | rectangle |
| Example 13 | KrF top resist layer composition | rectangle | rectangle | rectangle | rectangle |
| Example 14 | KrF top resist layer composition | rectangle | rectangle | rectangle | rectangle |
| Example 15 | KrF top resist layer composition | rectangle | rectangle | rectangle | rectangle |

TABLE 4

| bottom resist layer composition | top resist layer composition | pattern profile after development | pattern profile after transfer-etching intermediate resist layer | pattern profile after transfer-etching bottom resist layer | pattern profile after transfer-etching substrate |
|---|---|---|---|---|---|
| Example 1 | ArF top resist layer composition | rectangle | rectangle | rectangle | rectangle |
| Example 2 | ArF top resist layer composition | rectangle | rectangle | rectangle | rectangle |
| Example 3 | ArF top resist layer composition | rectangle | rectangle | rectangle | rectangle |
| Example 4 | ArF top resist layer composition | rectangle | rectangle | rectangle | rectangle |
| Example 5 | ArF top resist layer composition | rectangle | rectangle | rectangle | rectangle |
| Example 6 | ArF top resist layer composition | rectangle | rectangle | rectangle | rectangle |
| Example 7 | ArF top resist layer composition | rectangle | rectangle | rectangle | rectangle |
| Example 8 | ArF top resist layer composition | rectangle | rectangle | rectangle | rectangle |
| Example 9 | ArF top resist layer composition | rectangle | rectangle | rectangle | rectangle |
| Example 10 | ArF top resist layer composition | rectangle | rectangle | rectangle | rectangle |
| Example 11 | ArF top resist layer composition | rectangle | rectangle | rectangle | rectangle |
| Example 12 | ArF top resist layer composition | rectangle | rectangle | rectangle | rectangle |
| Example 13 | ArF top resist layer composition | rectangle | rectangle | rectangle | rectangle |
| Example 14 | ArF top resist layer composition | rectangle | rectangle | rectangle | rectangle |
| Example 15 | ArF top resist layer composition | rectangle | rectangle | rectangle | rectangle |
| Comparative Example 1 | ArF top resist layer composition | rectangle | rectangle | rectangle | taper and film loss |
| Comparative Example 2 | ArF top resist layer composition | rectangle | rectangle | rectangle | rectangle |

As shown in Table 3, it was found that, in the case of using the bottom resist layer compositions of Examples 1, 4, 8-15, both a resist pattern profile after development on exposure to KrF, a pattern profile transferred to an intermediate resist layer, a pattern profile transferred to a bottom resist layer, and a pattern profile transferred to a substrate were excellent, and a pattern with a high aspect ratio could be formed.

In addition, as shown in Table 4, it was found that, in the case of using the bottom resist layer compositions of Examples 1-15, both a resist pattern profile after development on exposure to ArF, a pattern profile transferred to an intermediate resist layer, a pattern profile transferred to a bottom resist layer, and a pattern profile transferred to a substrate were excellent, and a pattern with a high aspect ratio could be formed.

[Evaluation of Dry Etching Resistance]

In a test of dry etching resistance, the solutions of the bottom resist layer compositions (Examples 1-15, Comparative Examples 1-2) prepared above were applied on a Si substrate 8 inches (about 200 mm) across, baked for 60 seconds at 300° C. in the Examples 1-3, and baked for 60 seconds at 200° C. in the Examples 4-15 and in the Comparative Examples 1-2, to form bottom resist layers with a thickness of 300 nm. They were evaluated under the two types of the following conditions.

1) Etching Test with $CF_4/CHF_3$ Gas

A difference in a thickness of bottom resist layers before and after etching was determined using dry-etching-system TE-8500P manufactured by Tokyo Electron, Ltd.

Etching conditions were the same as those of observation of a pattern profile formed on a substrate.

The results were shown in Table 5.

TABLE 5

| bottom resist layer composition | a gas etching rate with $CF_4/CHF_3$ gas (nm/min) |
|---|---|
| Example 1 | 98 |
| Example 2 | 92 |
| Example 3 | 95 |
| Example 4 | 100 |
| Example 5 | 99 |
| Example 6 | 97 |
| Example 7 | 102 |
| Example 8 | 97 |
| Example 9 | 98 |
| Example 10 | 88 |
| Example 11 | 96 |
| Example 12 | 98 |
| Example 13 | 96 |
| Example 14 | 82 |
| Example 15 | 91 |
| Comparative Example 1 | 120 |
| Comparative Example 2 | 95 |

2) Etching Test with $Cl_2/BCl_3$ Gas

The difference in a thickness of a bottom resist layer before and after etching was determined using dry-etching-system L-507D-L manufactured by Nichiden ANELVA Corporation.

Etching conditions are shown below.

| | |
|---|---|
| Chamber pressure | 40.0 Pa |
| RF power | 300 W |
| Gap | 9 mm |
| $Cl_2$ gas flow rate | 30 ml/min |
| $BCl_3$ gas flow rate | 30 ml/min |
| $CHF_3$ gas flow rate | 100 ml/min |
| $O_2$ gas flow rate | 2 ml/min |
| Time | 60 sec |

The results were shown in Table 6.

TABLE 6

| bottom resist layer composition | a gas etching rate with $Cl_2/BCl_3$ gas (nm/min) |
|---|---|
| Example 1 | 105 |
| Example 2 | 100 |
| Example 3 | 98 |
| Example 4 | 108 |
| Example 5 | 102 |
| Example 6 | 100 |
| Example 7 | 108 |
| Example 8 | 106 |
| Example 9 | 105 |
| Example 10 | 98 |
| Example 11 | 104 |
| Example 12 | 108 |
| Example 13 | 103 |
| Example 14 | 92 |
| Example 15 | 100 |
| Comparative Example 1 | 133 |
| Comparative Example 2 | 102 |

As shown in Tables 5 and 6, an etching rate of the Examples 1-15 in $CF_4/CHF_3$ gas etching and $Cl_2/BCl_3$ gas etching was lower than that of the Comparative Example 1 (m-cresol novolac resin). Therefore, it was found that the bottom resist layers of the Examples 1-15 had an extremely high etching resistance during etching a substrate.

The present invention is not limited to the above-described embodiment. The above-described embodiment is a mere example, and those having the substantially same structure as that described in the appended claims and providing the similar action and effects are included in the scope of the present invention.

What is claimed is:

1. A bottom resist layer composition for a multilayer-resist film used in lithography which comprises, at least, a polymer having a repeating unit represented by the following general formula (1),

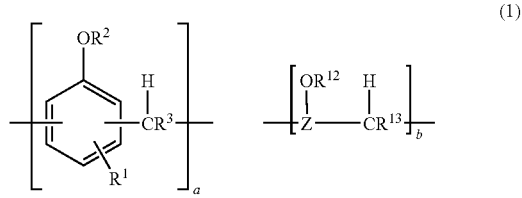

wherein $R^1$ represents any one of a hydrogen atom, a linear or branched alkyl group having 1-10 carbon atoms, an aryl group having 6-10 carbon atoms, a linear or branched alkenyl group having 2-10 carbon atoms, and a halogen atom, $R^2$ and $R^{12}$ independently represent any one of a hydrogen atom, a linear, branched or cyclic alkyl group having 1-6 carbon atoms, a linear, branched or cyclic alkenyl group having 2-6 carbon atoms, an aryl group having 6-10 carbon atoms, an acyl group or an alkoxy carbonyl group having 1-10 carbon atoms, a group forming an acetal group with an oxygen atom bonded with $R^2$ or $R^{12}$ in the above general formula (I), and a glycidyl group, $R^3$ and $R^{13}$ independently represent any one of a hydrogen atom, a linear, branched or cyclic alkyl group having 1-10 carbon atoms, and an aryl group having 6-10 carbon atoms, a and b satisfy $0<a<1$, $0<b<1$, and $0<a+b\leq 1$, and Z represents any one of indene, benzothiophene, anthracene, acenaphthylene, pyrene, fluorene, phenanthrene, azulene, heptalene, biphenylene, indacene, fluoracene, naphthacene, aceanthrylene, and perylene, wherein the multilayer-resist film is a trilayer resist film comprising a bottom resist layer formed on a substrate, an intermediate resist layer containing silicon atoms formed on the bottom resist layer, and a top resist layer of a photoresist composition formed on the intermediate resist layer.

2. The bottom resist layer composition according to claim 1 wherein the bottom resist layer composition further contains one or more of any one of a cross-linker, an acid generator and an organic solvent.

* * * * *